(12) United States Patent  
Hayase et al.

(10) Patent No.: US 8,156,833 B2  
(45) Date of Patent: Apr. 17, 2012

(54) LINEAR ACTUATOR

(75) Inventors: Isao Hayase, Tsuchiura (JP); Kenichiro Tokuo, Munich (DE); Hiroyuki Sakamoto, Hitachinaka (JP); Itsuro Sawada, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1154 days.

(21) Appl. No.: 11/958,681

(22) Filed: Dec. 18, 2007

(65) Prior Publication Data

US 2008/0173116 A1 Jul. 24, 2008

(30) Foreign Application Priority Data

Dec. 19, 2006 (JP) .................................. 2006-341349
Mar. 15, 2007 (JP) .................................. 2007-066943

(51) Int. Cl.
*H02N 2/02* (2006.01)
*H02N 2/04* (2006.01)
(52) U.S. Cl. ............................................................ 74/88
(58) Field of Classification Search ................ 74/88–110
See application file for complete search history.

(56) References Cited

U.S. PATENT DOCUMENTS

| 7,898,121 B2 * | 3/2011 | Ramsay et al. ................. 310/14 |
| 2006/0017535 A1 * | 1/2006 | Nagasaki ....................... 335/220 |
| 2006/0272714 A1 * | 12/2006 | Carrillo et al. ........... 137/596.17 |
| 2010/0301978 A1 * | 12/2010 | Ishibashi ....................... 335/255 |

FOREIGN PATENT DOCUMENTS

| JP | 9-303451 A | 11/1997 |
| JP | 2005-33978 A | 2/2005 |

* cited by examiner

*Primary Examiner* — Raymond W Addie
(74) *Attorney, Agent, or Firm* — Crowell & Moring LLP

(57) ABSTRACT

A linear actuator has an alternating drive apparatus, an alternating motion member, a fixing member fixed to a housing member, a direct acting member, a first wedge joining mechanism incorporated between the alternating motion member and the direct acting member, and a second wedge joining mechanism incorporated between the fixing member and the direct acting member. The first wedge joining mechanism and the second wedge joining mechanism have an inclined surface, a non-inclined surface at a constant distance from the central axis, and a wedge member arranged between the inclined surface and the non-inclined surface. The non-inclined surfaces of the first and second wedge joining mechanisms are formed on the direct acting member. The inclined surface of the first wedge joining mechanism is formed on the alternating motion member, and the inclined surface of the second wedge joining mechanism is formed to the fixing member.

9 Claims, 20 Drawing Sheets

(SECTION A-A)

(SECTION A-A)

(SECTION B-B)

(SECTION C-C)

(SECTION D-D)

(SECTION E-E)

(SECTION A-A)

(SECTION A-A)

(SECTION A-A)

(SECTION A-A)

(SECTION B-B)
(SECTION E-E)

(SECTION C-C)
(SECTION D-D)

LINEAR ACTUATOR

CLAIM OF PRIORITY

The present application claims priority from Japanese application serial No. 2006-341349, filed on Dec. 19, 2006, and Japanese application serial No. 2007-066943, filed on Mar. 15, 2007, the contents of which are hereby incorporated by reference into this application.

BACKGROUND OF THE INVENTION

1. Field of the Invention

The present invention relates to a linear actuator utilized as a drive source of various devices including a car and more particularly to a linear actuator for accumulating one-way motion from an alternating motion with a micro amplitude by an alternating drive source for generating drive force back and forth in the axial direction, thereby creating a direct motion.

2. Prior Art

Devices such as an automatic transmission (automatic MT) for driving a shift lever for switching the combination of the shift gears for a car by a motor instead of a hand and a variable operating valve device for controlling optimally the lift amount of the valve of an engine or the opening period thereof according to the operation state realize the compatibility of improvement of the comfortableness of a car with improvement of fuel expenses, thus future enlargement of use is expected. Unlike other more general machines driven directly by a rotation actuator such as a motor for repeating continuously a predetermined operation, the concerned devices are controlled directly at optimum positions according to the circumstances and instead of the rotation actuator, are driven by a linear actuator for outputting a direct motion.

Therefore, in the devices such as the automatic transmission and variable operating valve device, the performance of the linear actuator controls the performance of the overall devices. For example, if there is a linear actuator for responding at a high speed available, a device using it can function at a high speed and if there is a compact linear actuator with high thrust available, an overall device incorporating it can be made compact. To minimize the control delay for a control subject such as the transmission gear ratio or valve operation for sudden changes in the operation conditions of a car such as the car speed and engine load changing every moment and maintain always the car in an optimum state, particularly the characteristic of the high speed response aforementioned is important.

As a linear actuator, conventionally, an article structured so as to create a direct motion by a ball screw and a worm gear from the rotary motion of the motor has been used, though to generate large thrust of the direct motion with limited motor torque, a concept is used that the motor is rotated at a high speed to ensure the output, and it is decelerated at the stage of realization of direct motion, thus large thrust is generated. Therefore, to speed up the direct motion, it is essential to speed up the rotation of the motor. On the other hand, the speedup of the linear actuator is evaluated by the shortness of the time required to move by a predetermined stroke from the standstill. This indicates that in a conventional linear actuator driven by a motor, the rotation system must be put into a high-speed rotation state in a short time, so that the output of the motor is consumed to increase the kinetic energy of the rotation system. In other words, it may be said that at start time of the linear actuator, a large inertia resistance is acted. In the linear actuator of the conventional type, the inertia resistance may be considered to be an obstacle to speedup.

As a means for avoiding the obstacle to speedup, a linear actuator for accumulating one-way motion from an alternating motion with a micro amplitude by an alternating drive source for generating drive force back and forth in the axial direction of a magnetostrictor, thereby creating a direct motion is known. Generally, the alternating drive source obtains only a micro amplitude, though can generate large thrust, so that there is no need to permit the magnetostrictor to move back and forth at a high speed, then decelerate, thereby enlarge the thrust, thus it can be expected that the inertia resistance will be reduced.

As a prior art of the linear actuator by the alternating drive source using the magnetostrictor, for example, as described in Patent Document 1, a linear actuator for acting a fluid pressure on a piston using a check valve, thereby generating a direct motion is proposed. It is disclosed as a one that a hydraulic chamber is formed at the end of the member for moving back and forth with a micro amplitude by the magnetostrictor, and a fluid is pumped in one direction by two check valves functioning as an inlet valve and a discharge valve, and the fluid pressure is acted on the piston, thus direct drive force is generated.

Further, as another prior art, as described in Patent Document 2, a linear actuator for generating a direct motion using a wedge mechanism for permitting only a relative motion in one axial direction is proposed. Also in this case, a linear actuator is disclosed that a first wedge mechanism having an alternating motion member for moving back and forth with a micro amplitude by the magnetostrictor for permitting only a relative motion in one axial direction is arranged between the alternating motion member and the output member for executing the direct motion, and furthermore, a second wedge mechanism for permitting only a relative motion in one axial direction is arranged between the output member and the fixed frame member, and the one-direction motion of the alternating motion is accumulated by a combination of the wedge mechanisms, thus a direct motion is generated.

Patent Document 1: Japanese Patent Application Laid-open Publication No. Hei 9 (1997)-303451

Patent Document 2: Japanese Patent Application Laid-open Publication No. 2005-33978

SUMMARY OF THE INVENTION

However, the prior art disclosed in Patent Document 1 aforementioned is structured so as to transfer the drive force for the direct motion via the fluid pressure and there are possibilities that the hydraulic oil in use externally leaks slowly due to the pressure difference. Therefore, problems of restrictions arise that the maintenance for replenishment is necessary and the art cannot be used in an environment disliking contamination due to leaked oil.

In the prior art disclosed in Patent Document 2 aforementioned, there is no need to enlarge the thrust by deceleration, and by accelerating the drive source to a high speed at start time, the inertia resistance can be avoided from increasing, though a problem arises that another factor, indicated below, for increasing the inertia resistance is left. Firstly, as a linear actuator for controlling each device, there is a case that a function for not only executing the direct motion in one direction but also switching the direct acting direction (switching one direction or the reverse direction) is essential, though in the prior art disclosed in Patent Document 2 aforementioned, the mechanical member for the switching function and the drive apparatus for driving it are structured so as to be mounted in the output member for executing the direct motion and a problem arises that by adding each mass, the inertia resistance is increased. Further, the drive apparatus of the mechanism for switching the direct acting direction executes the direct motion, so that the lead wire for supplying power to it is deformed repeatedly in correspondence with the operation of the actuator, so that there is a problem imposed in the durability.

Further, in the prior art disclosed in Patent Document 2 aforementioned, the output member for executing the direct motion is arranged on the outer periphery of the alternating motion member for moving back and forth with a micro amplitude by the alternating drive source, so that the diameter is increased, and the mass of the output member itself is increased, thus a problem arises that the inertia resistance is increased.

Furthermore, in the prior art disclosed in Patent Document 2 aforementioned, there are wedge joining mechanisms installed between the output member for executing the direct motion and the alternating motion member and between the output member and the frame member, and there are two systems of wedge joining mechanisms for inhibiting the relative motion in one axial direction and other axial direction which are installed in each of them, and furthermore, in each system, a plurality of wedge joining mechanisms are arranged in the circumferential direction, so that many wedge joining mechanisms, many switching mechanisms corresponding to them, and drive apparatuses thereof are required. In correspondence with it, a problem arises that the number of components and the processing man-hour of the inclined surfaces of the wedge joining mechanisms are increased, causing an increase in cost.

Further, in the prior art disclosed in Patent Document 2, there is no need to enlarge the thrust by deceleration and by accelerating the drive source to a high speed at start time, the inertia resistance can be avoided from increasing. However, only by the wedge joining section for transferring the drive force of the direct motion, the output shaft is supported in the radial direction. Therefore, problems arise that (1) there are possibilities that a load acting externally on the output shaft may act on the wedge joining section, thereby may damage it or adversely affect the operation of the generation mechanism of the direct motion, (2) there are possibilities that the inertia force of the alternating motion member may impose a problem of vibration as a vibration source, and (3) to avoid interference of the drive section of the alternating motion with the output shaft of the direct motion, it is difficult to realize miniaturization of the apparatus or extension of the output stroke.

The object of the present invention is intended to provide a linear actuator enable to accumulate the directional component of the alternating motion by the alternative drive source for creating a direct motion, and realize a high-speed response.

To achieve the above object, the present invention adopts mainly the following constitution.

A linear actuator comprising: an alternating drive apparatus for generating drive force back and forth in the axial direction, an alternating motion member for executing alternating motion with a micro amplitude by the alternating drive apparatus, a fixing member fixed to a housing member, a direct acting member for executing direct motion back and forth in the axial direction, a first wedge joining mechanism incorporated between the alternating motion member and the direct acting member for permitting a relative displacement in one axial direction and inhibiting a relative displacement in the other axial direction, and a second wedge joining mechanism incorporated between the fixing member and the direct acting member for permitting a relative displacement in one axial direction and inhibiting a relative displacement in the other axial direction, wherein: the first wedge joining mechanism and second wedge joining mechanism include an inclined surface composed of an inclined surface at a distance from the central axis increasing in the axial direction and an inclined surface at a distance decreasing, a non-inclined surface at a constant distance from the central axis, wedge members arranged between the inclined surface and the non-inclined surface, holding members of the wedge members for inhibiting wedge joining by the inclined surface, non-inclined surface, and wedge members, and a wedge joint inhibition mechanism composed of the drive sections of the holding members, and the non-inclined surface of the first wedge joining mechanism and the non-inclined surface of the second wedge joining mechanism are installed on the direct acting member, and the inclined surface of the first wedge joining mechanism is installed on the alternating motion member, and the inclined surface of the second wedge joining mechanism are fixed to the fixing member.

A linear actuator comprising: first and second joint members, a housing member for storing the first and second joint members, a drive apparatus for driving the first and second joint members in a mutually approaching direction thereof and in a separating direction thereof in the housing member, a direct acting member joined to the first and second joint members for executing a linear motion in an axial direction, a first wedge joining mechanism incorporated between the first joint member and the direct acting member for permitting a relative displacement in one axial direction between the first joint member and the direct acting member and inhibiting a relative displacement in the other axial direction between the first joint member and the direct acting member, and a second wedge joining mechanism incorporated between the second joint member and the direct acting member for permitting a relative displacement in one axial direction between the second joint member and the direct acting member and inhibiting a relative displacement in the other axial direction between the second joint member and the direct acting member, wherein: the first wedge joining mechanism and the second wedge joining mechanism include an inclined surface at a distance from a central axis changing in the axial direction, a non-inclined surface at a constant distance from the central axis, and a wedge member arranged between them, and the direct acting member is supported in a radial direction by a shaft support section provided in the housing member.

A linear actuator comprising: an alternating drive apparatus for generating drive force back and forth in an axial direction, an alternating motion member for executing alternating motion with a micro amplitude by the alternating drive apparatus, a fixing member fixed to a housing member, a direct acting member for executing direct motion back and forth in the axial direction, a first wedge joining mechanism incorporated between the alternating motion member and the direct acting member for permitting a relative displacement in one axial direction and inhibiting a relative displacement in the other axial direction, and a second wedge joining mechanism incorporated between the fixing member and the direct acting member for permitting a relative displacement in one axial direction and inhibiting a relative displacement in the other axial direction, wherein: the first wedge joining mechanism and the second wedge joining mechanism include an inclined surface composed of an inclined surface at a distance from a central axis increasing in the axial direction and an inclined surface at a distance decreasing, a non-inclined surface at a constant distance from the central axis, a wedge member arranged between the inclined surface and the non-inclined surface, a holding member of the wedge member for inhibiting wedge joining by the inclined surface, the non-inclined surface, and the wedge member, and a wedge joint inhibition mechanism composed of a drive section of the holding member, and the non-inclined surface of the first wedge joining mechanism and the non-inclined surface of the second wedge joining mechanism are formed on the direct acting member, and the inclined surface, the holding member, and the wedge member are restricted on a position in a moving direction of the direct acting member to the housing member and are restricted on a position in a radial direction by the direct acting member.

According to the present invention, a linear actuator enable to accumulate the directional component of the alternating motion by the alternative drive source for creating a direct motion, and realize a high-speed response can be provided.

DETAILED DESCRIPTION OF THE INVENTION

The linear actuators relating to the first, second, third, fourth and fifth embodiments of the present invention will be explained in detail below with reference to FIGS. 1 to 20.
[First Embodiment]

Figure 1:
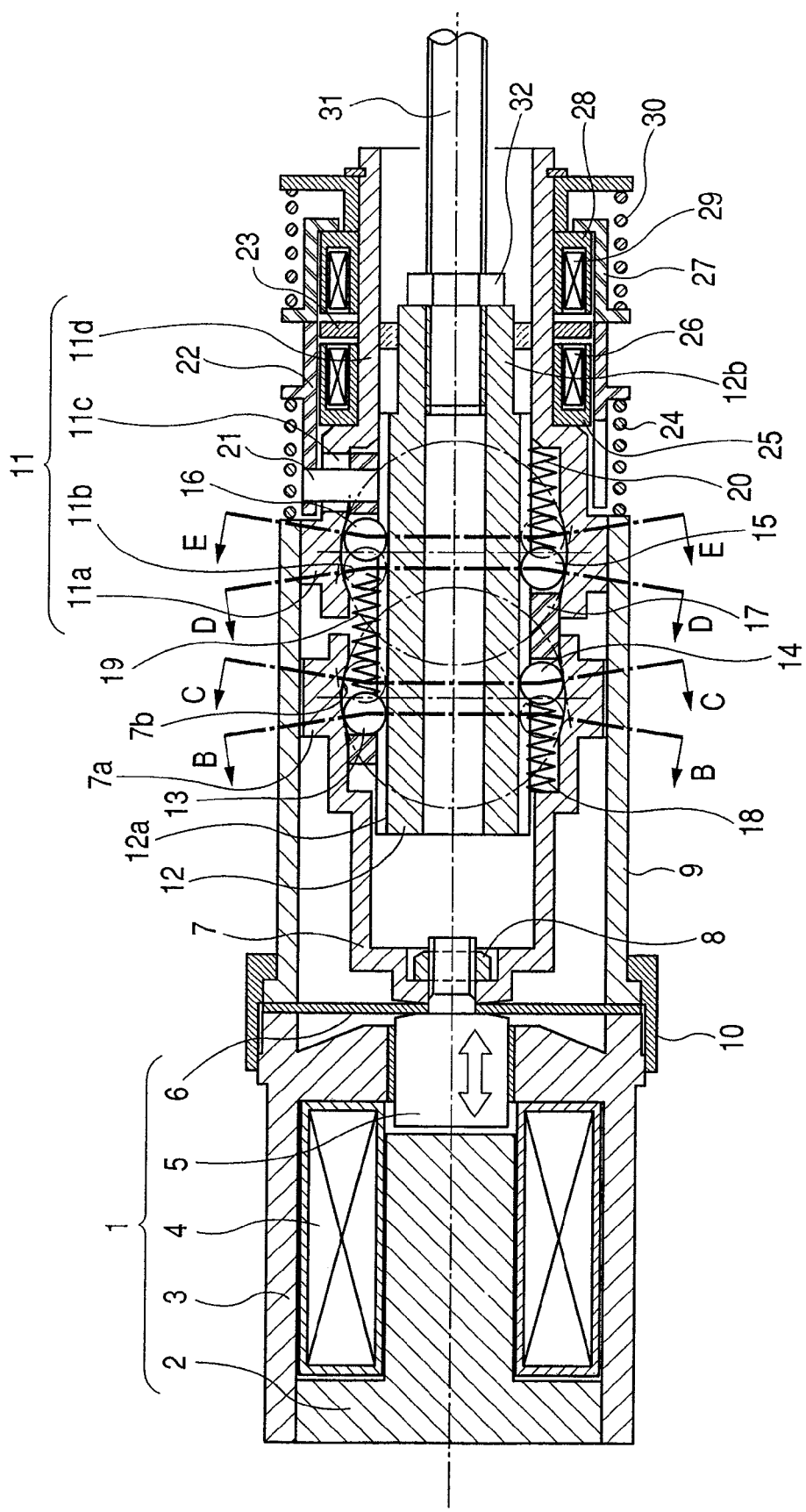
FIG. 1 is a cross sectional view in the axial direction of the linear actuator relating to the first embodiment of the present invention when the output shaft thereof is stopped, which is a sectional view A-A shown in FIGS. 2 to 5.
Figure 2:
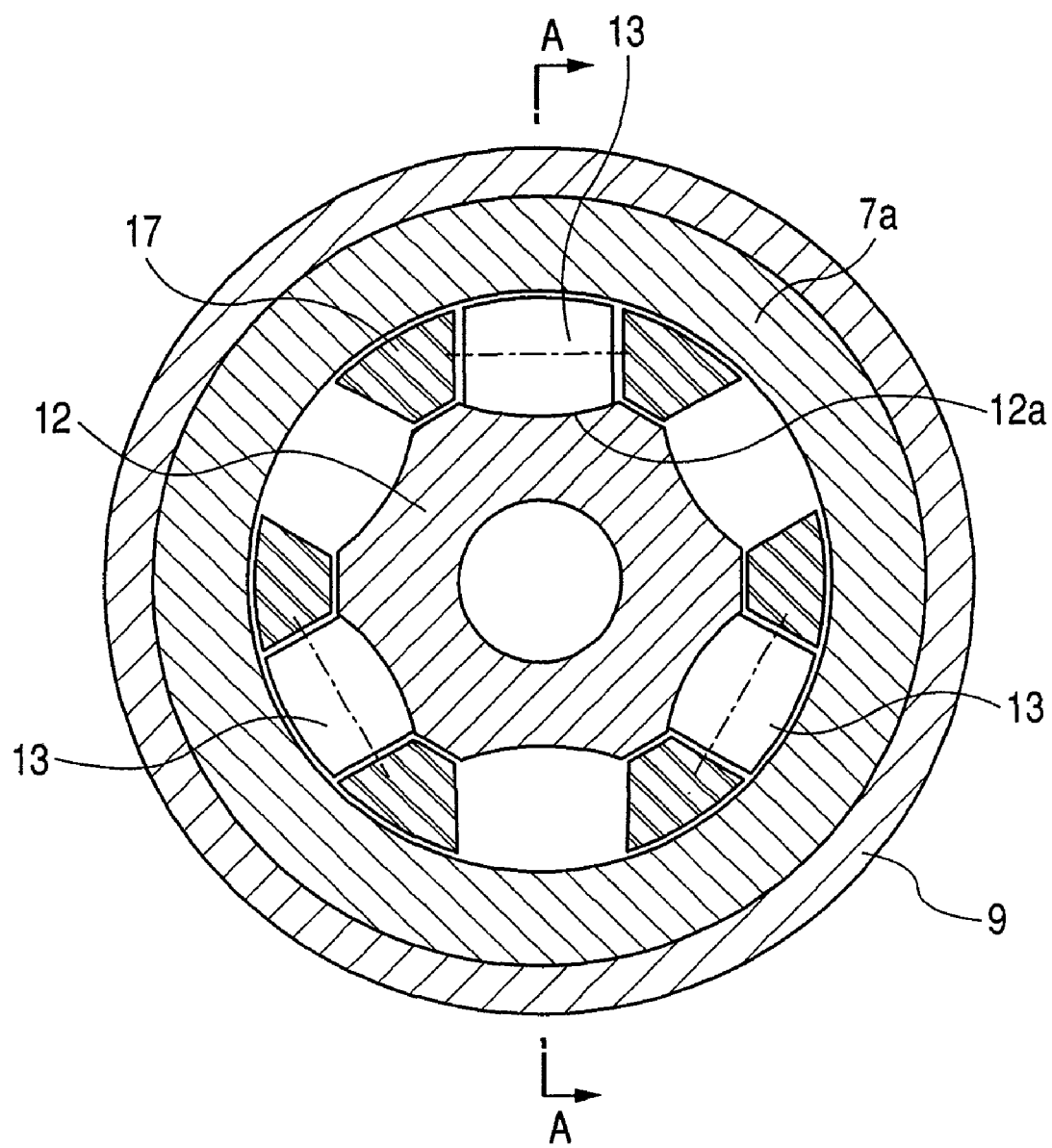
FIG. 2 is a transverse cross sectional view of the section B-B of the linear actuator relating to the first embodiment of the present invention shown in FIG. 1.
Figure 3:
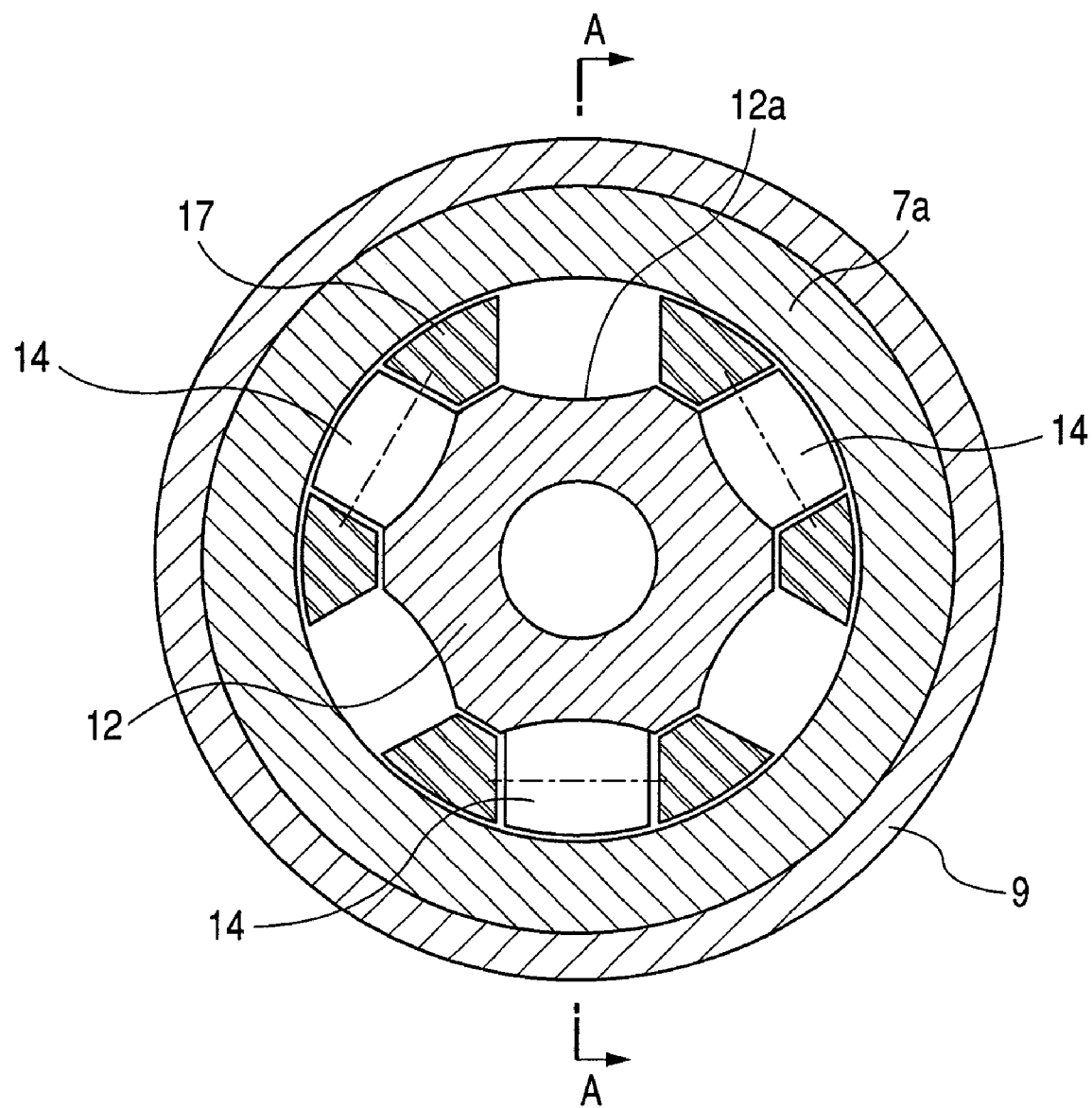
FIG. 3 is a transverse cross sectional view of the section C-C of the linear actuator relating to the first embodiment of the present invention shown in FIG. 1.
Figure 4:
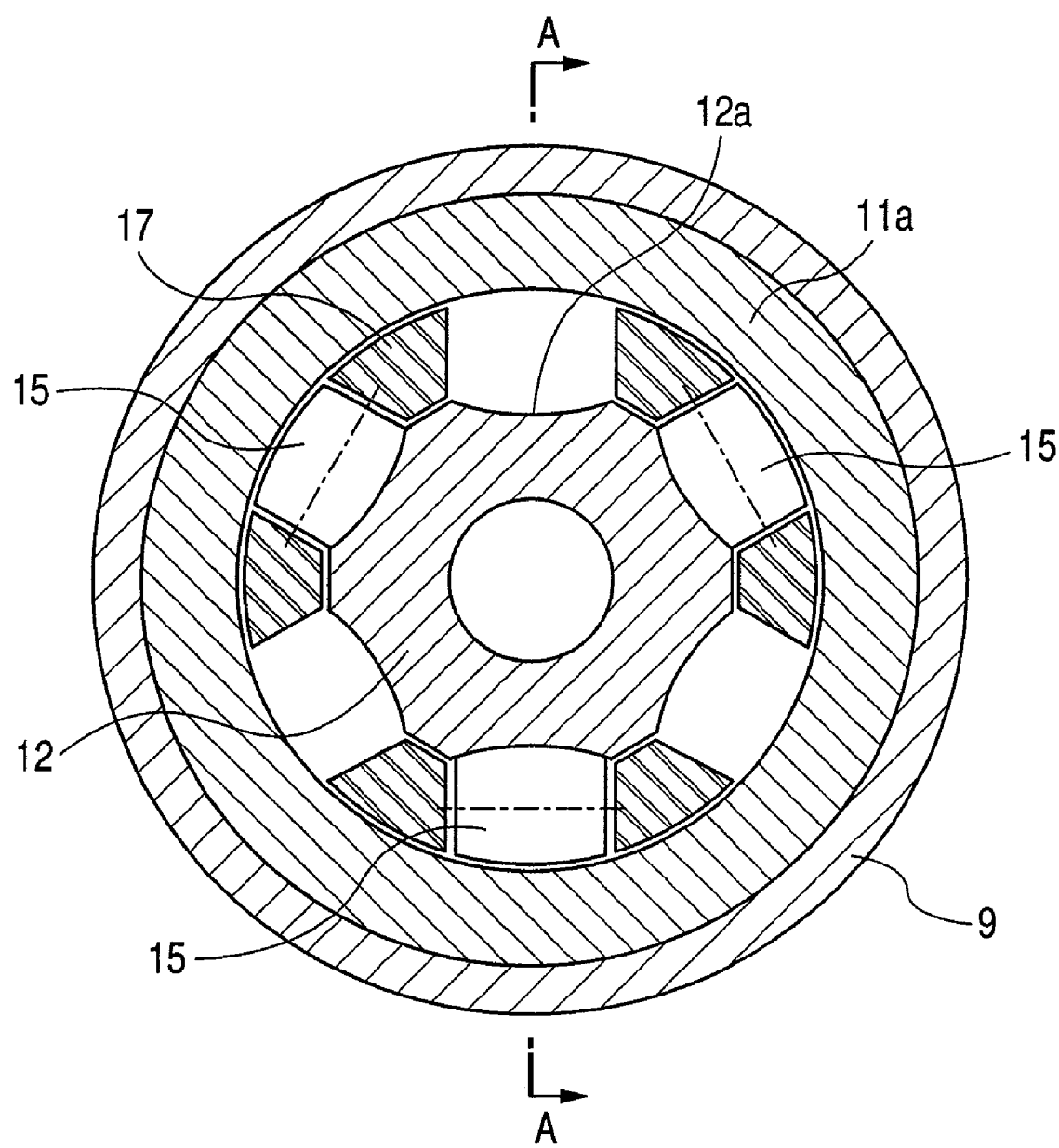
FIG. 4 is a transverse cross sectional view of the section D-D of the linear actuator relating to the first embodiment of the present invention shown in FIG. 1.
Figure 5:
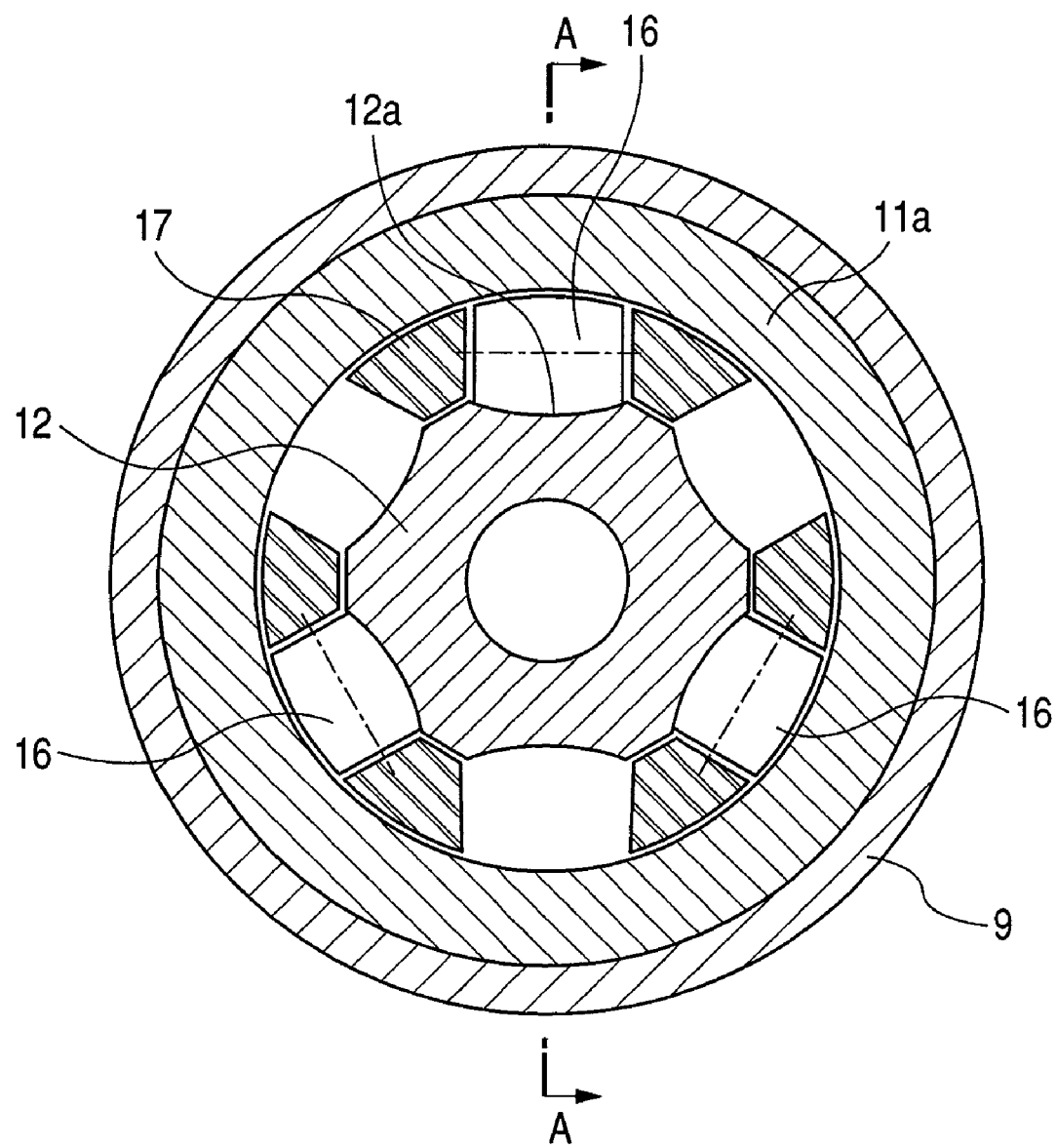
FIG. 5 is a transverse cross sectional view of the section E-E of the linear actuator relating to the first embodiment of the present invention shown in FIG. 1.

The linear actuator relating to the first embodiment of the present invention will be explained by referring to FIGS. 1 to 10. FIG. 1 is a cross sectional view in the axial direction of the linear actuator relating to the first embodiment of the present invention when the output shaft thereof is stopped, which is a sectional view A-A shown in FIGS. 2 to 5. FIG. 2 is a transverse cross sectional view of the section B-B shown in FIG. 1. FIG. 3 is a transverse cross sectional view of the section C-C shown in FIG. 1. FIG. 4 is a transverse cross sectional view of the section D-D shown in FIG. 1. FIG. 5 is a transverse cross sectional view of the section E-E shown in FIG. 1.

Figure 6:
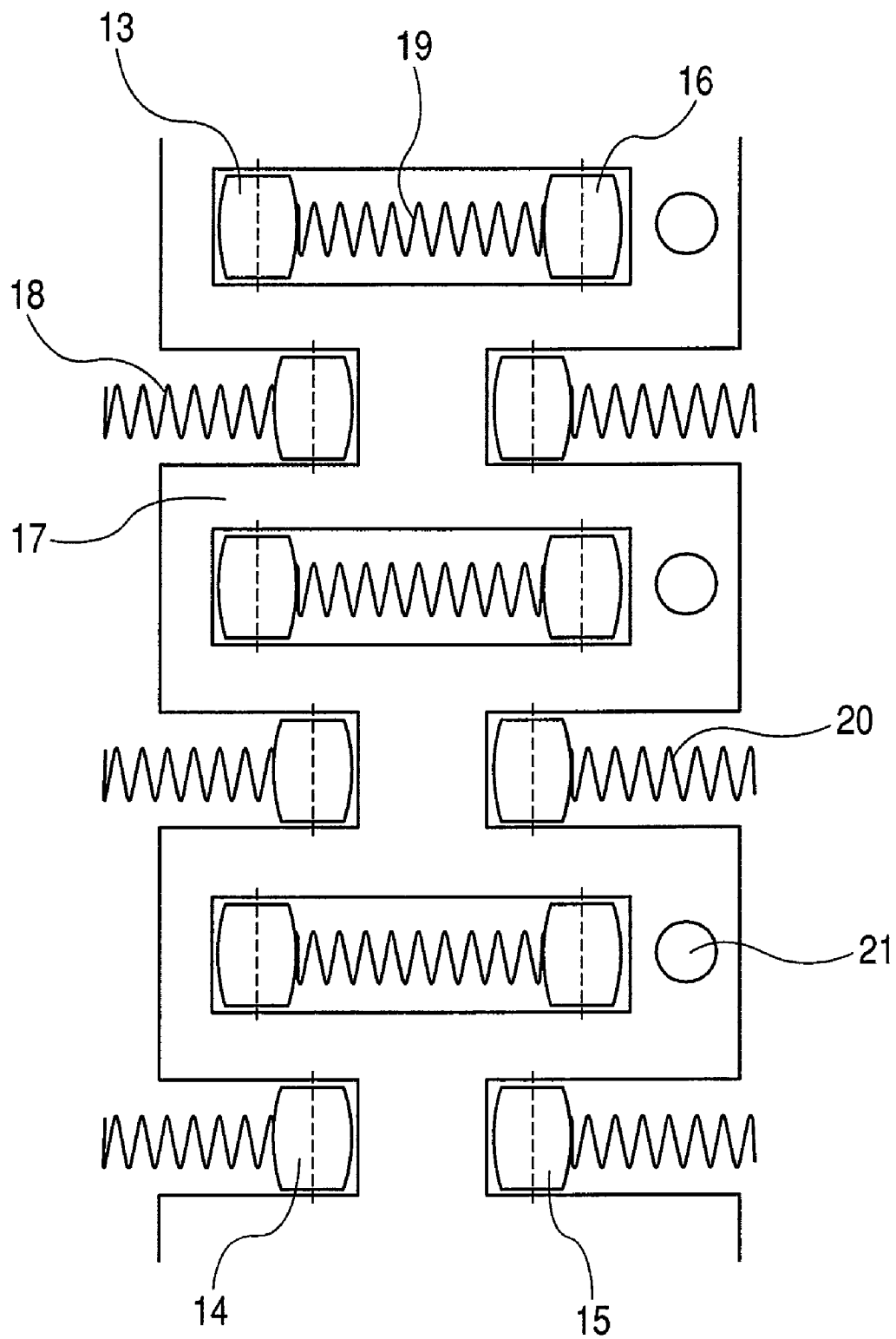
FIG. 6 is a drawing of the wedge joining mechanism of the linear actuator arranged in the circumferential direction shown in FIG. 1 which is developed on a plane.
Figure 7:
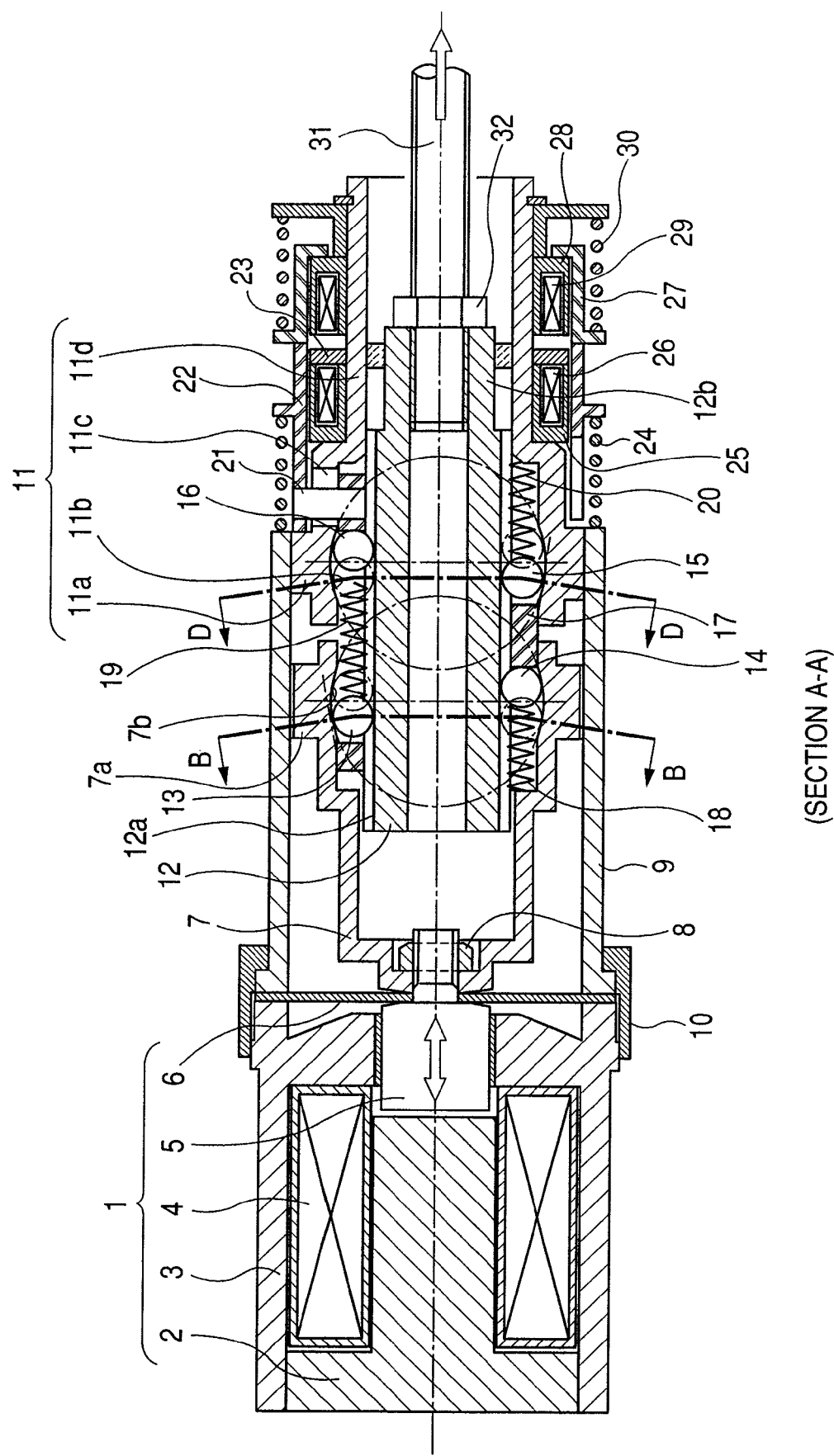
FIG. 7 is a cross sectional view in the axial direction of the linear actuator relating to the first embodiment when the output shaft thereof is driven in the right direction in the drawing.
Figure 8:
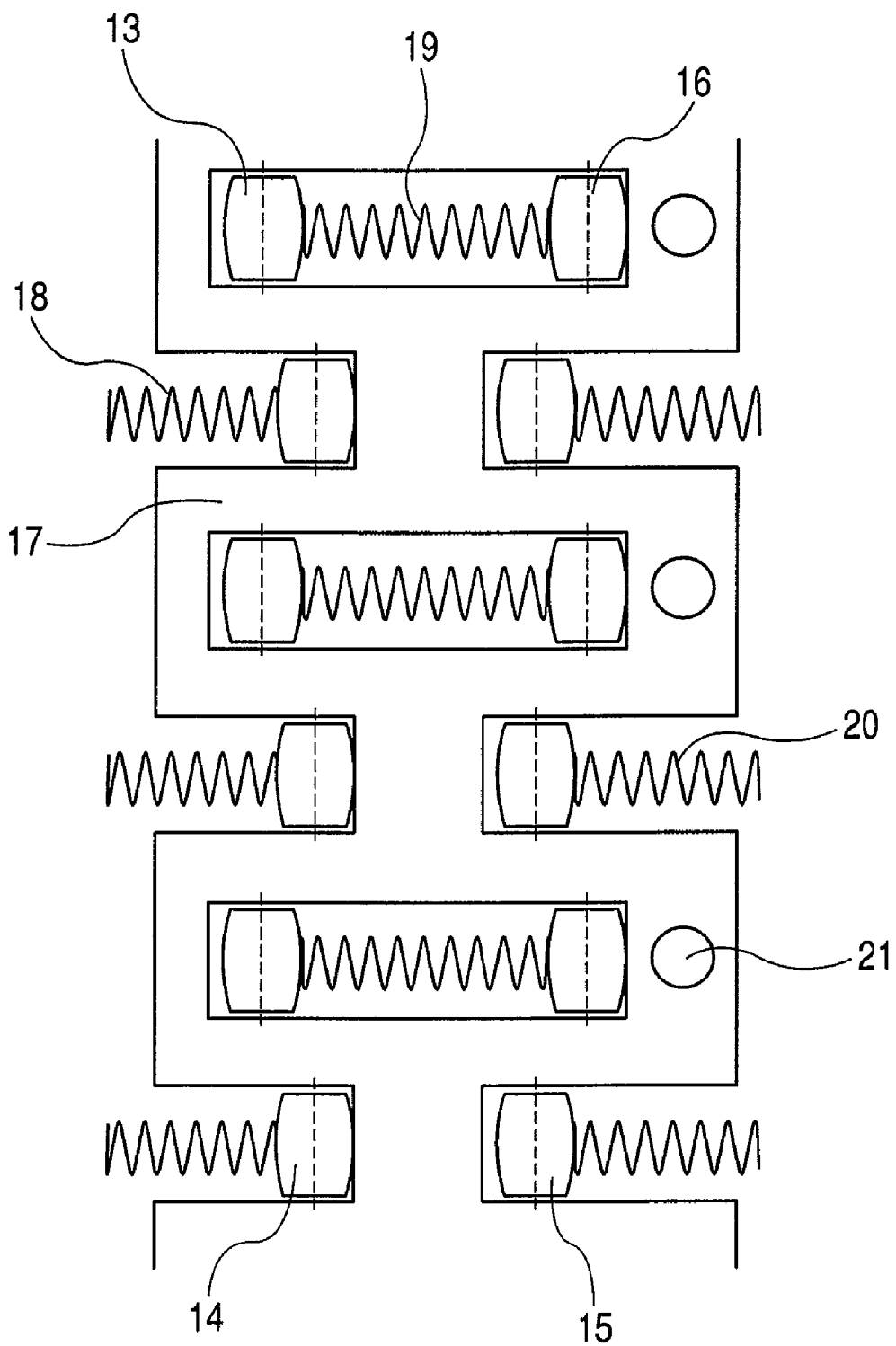
FIG. 8 is a drawing of the wedge joining mechanism of the linear actuator arranged in the circumferential direction shown in FIG. 7 which is developed on a plane.
Figure 9:
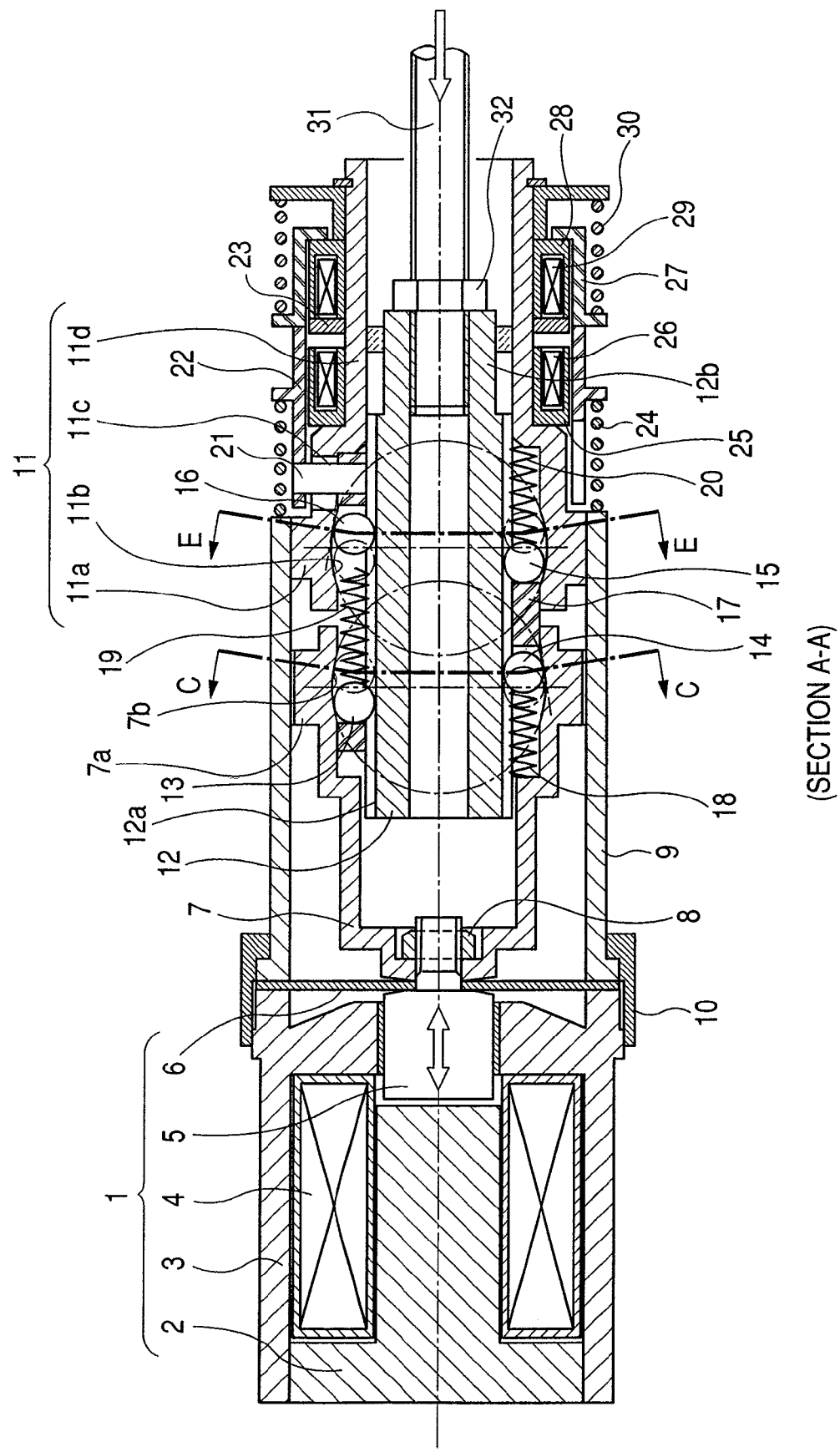
FIG. 9 is a cross sectional view in the axial direction of the linear actuator relating to the first embodiment when the output shaft thereof is driven in the left direction in the drawing.
Figure 10:
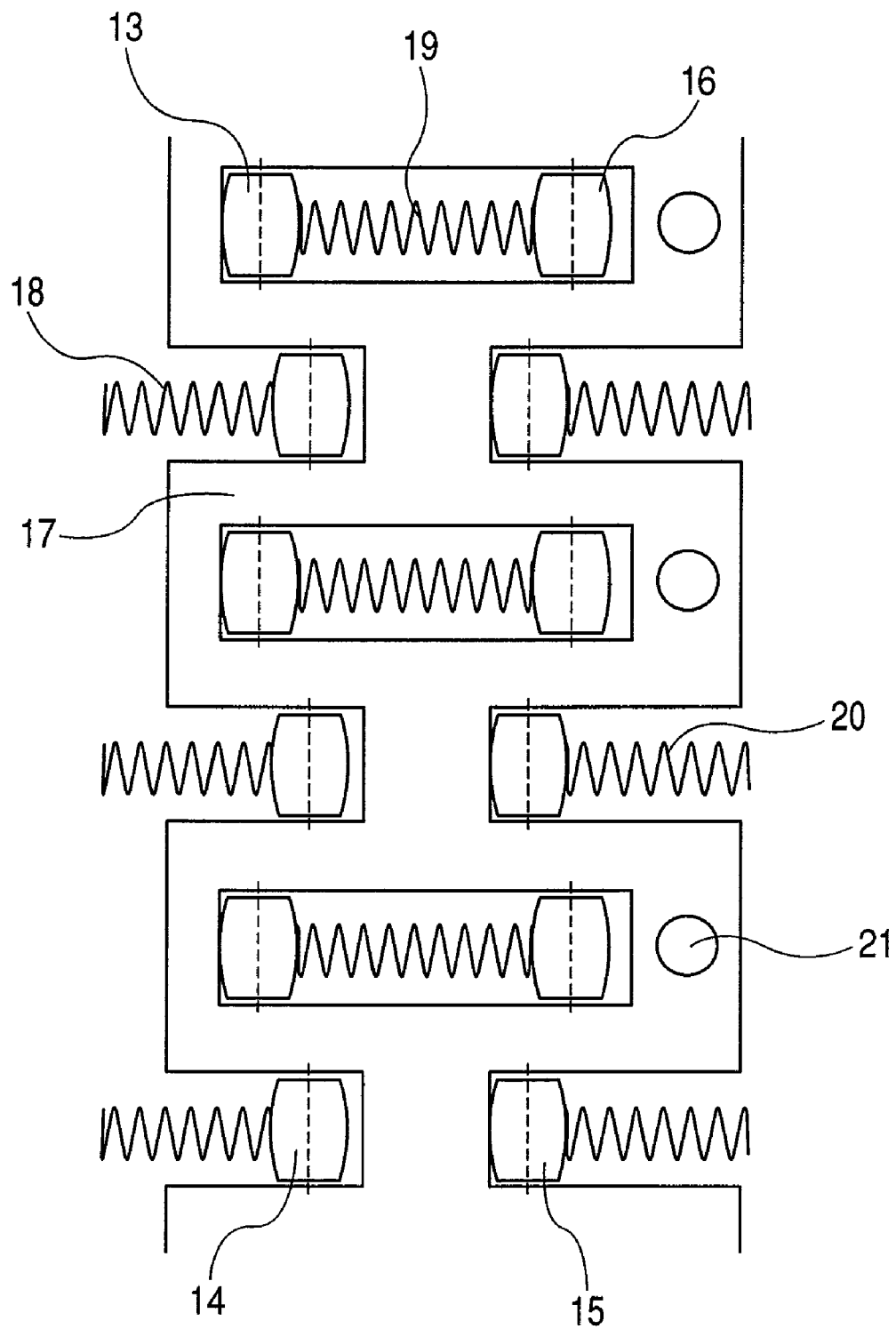
FIG. 10 is a drawing of the wedge joining mechanism of the linear actuator arranged in the circumferential direction shown in FIG. 9 which is developed on a plane.

FIG. 6 is a drawing of the wedge joining mechanism of the linear actuator arranged in the circumferential direction shown in FIG. 1 which is developed on a plane. FIG. 7 is a cross sectional view in the axial direction of the linear actuator relating to the first embodiment when the output shaft thereof is driven in the right direction in the drawing. FIG. 8 is a drawing of the wedge joining mechanism of the linear actuator arranged in the circumferential direction shown in FIG. 7 which is developed on a plane. FIG. 9 is a cross sectional view in the axial direction of the linear actuator relating to the first embodiment when the output shaft thereof is driven in the left direction in the drawing. FIG. 10 is a drawing of the wedge joining mechanism of the linear actuator arranged in the circumferential direction shown in FIG. 9 which is developed on a plane.

In FIG. 1, an alternating drive apparatus 1 is composed of a fixed iron core 2, a frame 3, a coil 4, a movable iron core 5, and a plate spring 6. To the movable iron core 5, the plate spring 6 and a vibration ring 7 which is an alternating motion member are concurrently fixed with a nut 8. The outer peripheral part of the plate spring 6 and the housing member 9 are concurrently fixed to the frame 3 with a peripheral nut 10. To the housing member 9, a fixing ring 11 is fixed.

On each inner peripheral side of a ring 7a of a vibration ring 7 and a ring 11a of the fixing ring 11, a direct acting rod 12 which is a direct acting member is arranged, and between the direct acting rod 12 and the ring 7a, three rollers (i) 13 are arranged as shown in FIG. 2 in the circumferential direction at the positions in the axial direction indicated by the section B-B, and three rollers (ii) 14 are arranged as shown in FIG. 3 in the circumferential direction at the positions in the axial direction indicated by the section C-C. Further, between the direct acting rod 12 and the ring 11a, three rollers (iii) 15 are arranged as shown in FIG. 4 in the circumferential direction at the positions in the axial direction indicated by the section D-D, and three rollers (iv) 16 are arranged as shown in FIG. 5 in the circumferential direction at the positions in the axial direction indicated by the section E-E.

The rollers 13, 14, 15, and 16 function as a wedge member and as shown in the development elevation in FIG. 6, are arranged in the up and down direction equivalent to the circumferential direction by the holding member 17 and have slight gaps against the respective axial end faces of the holding member 17. Each of pressing springs (ii) 18 is arranged between the vibration ring 7 and the roller (ii) 14 and presses the roller (ii) 14 rightward in the axial direction in the drawing. Each of pressing springs (i-iv) 19 is arranged between the roller (i) 13 and the roller (iv) 16 and presses the rollers in the axial direction inversely to each other. Each of pressing springs (iii) 20 is arranged between the fixing ring 11 and the roller (iii) 15 and presses the roller (iii) leftward in the drawing in the axial direction.

On each inner peripheral surface of the ring 7a of the vibration ring 7 and the ring 11a of the fixing ring 11, the spherical surface portion 7b and spherical surface portion 11b are formed. The contour shape of the outside diameter part of each roller is formed at a similar curvature to the great circle (the circle of the section cut along the plane passing the center of the sphere) of the sphere of the spherical surface portion 7b or 11b, thus each roller can make almost line contact with the spherical surface portion 7b or 11b (as found from the shape of the rollers 13 to 16 shown in FIGS. 1 and 2, each roller is in a shape that both ends of an acorn are cut off or in a shape of a drum having a swelled body center, and the roller is arranged so that the central axis passing both cut sections is made parallel with the sheet of paper of FIG. 2, and the shape viewed from the perpendicular surface of the central axis is the circular shape of the rollers shown in FIG. 1). The direct acting rod 12 has a sectional shape as shown in FIGS. 2 to 5 and on the part thereof with which the outside diameter part of each roller is in contact, the concave groove 12a at an almost similar curvature to the great circle of the spherical surface is formed. The spherical surface portions 7b and 11b are in the same size and the rollers are all the same in the contour shape of the outside diameter part. As a result, the rollers (i) and (iv) can share the concave groove 12a with which they are in contact and the rollers (ii) and (iii) can share the concave groove 12a with which they are in contact.

Each roller is in contact with each spherical surface at the shifted position in the axial direction (an output shaft 31) from the spherical center of the spherical surface portion 7b or 11b (on the sheet of paper of FIG. 1, the rollers 13 and 14 are shifted left and right) and the spherical surface portions at the contacting parts are inclined in the axial direction (in FIG. 1, the spherical surface portion 7b is tapered). The roller (i) 13 and roller (ii) 14 are in contact with the spherical surface portion 7b at the shifted positions in the reverse axial directions from the spherical center, so that the inclination directions of the spherical surface portions in contact are reverse to each other. The roller (iii) 15 and roller (iv) 16 are also in contact with the spherical surface portion 11b at the shifted positions in the reverse axial directions from the spherical center, so that the inclination directions of the spherical surface portions in contact are reverse to each other. The direct acting rod 12 has a part formed in a fixed transverse cross sectional shape and the concave groove 12a existing in the part is a non-inclined surface not inclined in the axial direction (in FIG. 1, the surfaces of the direct acting rod 12 in contact with the rollers 13 to 16 are not inclined in the axial direction of the output shaft 31).

The axial position of the holding member 17 shown in FIG. 1 is a position having a slight gap formed between the axial end faces thereof and all the rollers (in FIG. 6, all the rollers form a slight gap against the end face of the holding member 17 in the axial direction of the output shaft 31), so that all the rollers are not inhibited from the axial movement by the holding member 17 and form wedge joints held between the spherical surface portion 7b or 11b and the concave groove 12a by each pressing force of the pressing spring (ii) 18, pressing springs (i-iv) 19, and pressing spring (iii) 20. Here, the spherical surface portion 7b or 11b is equivalent to an inclined surface for forming a wedge joint, and the rollers (i) 13 to (iv) 16 are equivalent to a wedge member, and the concave groove 12a is equivalent to a non-inclined surface.

In the neighborhood of the ends of the holding member 17 in the right directions shown in FIG. 1, three connection pins 21 are fixed and are projected on the outer peripheral side from an opening 11c formed in the fixing ring 11 and the projected part thereof is fixed to a slide member (i) 22. Furthermore, in the neighborhood of the end of the slide member (i) 22 in the right direction, a disk 23 made of a magnetic substance is fixed. The slide member (i) 22 is pressed in the right direction in the drawing by a pressing spring (v) 24. On the left of the disk 23, a coil (i) 26 stored in a U-shaped magnetic case (i) 25 is fixed and when power is supplied to the coil (i) 26, the disk 23 and magnetic case (i) 25 form a magnetic circuit and can attract the disk 23 in the left direction.

On the right of the slide member (i) 22, a slide member (ii) 27 is arranged and on the right of the disk 23, a coil (ii) 29 stored in a U-shaped magnetic case (ii) 28 is fixed to a nose 11d of the fixing ring 11. The slide member (ii) 27 is pressed leftward in the drawing by a pressing spring (vi) 30 having a larger pressing force than that of the pressing spring (v) 24, though it makes contact with the magnetic case (ii) 28 fixed to the nose lid, thereby is restricted on leftward movement. When power is supplied to the coil (ii) 28, the disk 23 and magnetic case (ii) 28 form a magnetic circuit and can attract the disk 23 in the right direction. At the end of a nose 12b of the direct acting rod 12, the output shaft 31 is fixed with a nut 32.

FIG. 1 shows the state that no power is supplied to both coils (i) 26 and (ii) 29. At this time, no magnetic attraction force is acted on the disk 23 in all the axial directions, so that for the slide members (i) 22 and (ii) 27, the axial positions thereof are decided according to the relative strength of the pressing springs. The slide members (i) 22 and (ii) 27 are pressed by the pressing springs (v) 24 and (vi) 30 in the reverse directions and press each other, though the pressing force of the pressing spring (vi) 30 is larger than the other, thus both move leftward as a whole, and the slide member (ii) 27 makes contact with the magnetic case (ii) 28 and stops. The disk 23, at this time, so as to reach almost the intermediate position between the magnetic case (i) 25 and the magnetic case (ii) 28, is fixed to the slide member (i) 22. Further, as shown in FIG. 6, the holding member 17, at that time, so as to reach the axial position having a slight axial gap between the respective axial end faces and all the rollers, is connected to the slide member (i) 22 via the connection pin 21.

By use of the aforementioned constitution, in the first embodiment of the present invention, no power is supplied to both coils (i) 26 and (ii) 29, thus the axial position of the holding member 17 is kept at the intermediate position, and a wedge joint is formed by the direct acting rod 12 and the inclined surfaces in both directions, and to prevent from moving in the axial direction by external force, the direct acting rod 12 and the output shaft 31 fixed to it can be fixed.

FIG. 7 shows the state that power is supplied only to the coil (i) 26. At this time, magnetic attraction force is acted on the disk 23 in the left direction and the slide member (i) 22 moves in the left direction until the disk 23 makes contact with the magnetic case (i) 25. At this time, the axial position relationship between the holding member 17 connected via the connection pin 21 and the rollers is as shown in FIG. 8.

FIG. 8 shows the state that the holding member 17 moves in the left direction together with the slide member (i) 22, so that the rollers (ii) 14 and (iv) 16 on the right of which the axial end face of the holding member 17 is located make contact with the holding member 17 and are pressed out in the left direction. Namely, the rollers (ii) 14 and (iv) 16, even if pressed in the right direction by the pressing springs (ii) 18 and (i-iv) 19, are inhibited by the axial end face of the holding member 17, thereby cannot execute wedge joining. As a result, only wedge joining on the sections B-B (FIG. 2) and D-D (FIG. 4) shown in FIG. 7 can be realized. Further, the wedge joints on the sections B-B and D-D are wedge joints by the inclined surface in which the distance from the central axis (the direct acting rod or output shaft) increases in the right direction of the shaft.

Here, the case that power supply to the coil 4 and interruption thereof are repeated will be considered. At time of power supply, a magnetic circuit is formed by the fixed iron core 2, frame 3, and movable iron core 5 and the movable iron core 5 is attracted by the fixed iron core 2 and is driven in the left direction by deforming the plate spring 6. At time of interruption, the attraction force is eliminated and the movable iron core 5 is driven in the right direction by the restoration force of the plate spring 6. If the rigidity of the plate spring 6 is increased sufficiently, it is possible to permit the movable iron core 5 to execute an alternating motion driven right and left with a micro amplitude by large force. Further, the state of the plate spring 6 shown in FIG. 7 indicates that it is at the neutral position of the left and right movement.

Next, the case that the vibration ring 7 fixed to the movable iron core 5 executes the alternating motion in the state shown in FIG. 7 will be considered. When the spherical surface portion 7b of the vibration ring 7 is moving in the right direction (during movement), the inclined surface of the wedge joint in the cross sectional view B-B is an inclined surface in which the distance from the central axis decreases in the left direction, so that the direct acting rod 12 cannot move in the left direction to the vibration ring 7. On the other hand, the inclined surface of the wedge joint by the spherical surface portion 11b of the fixing ring 11 in the cross sectional view D-D is an inclined surface in which the distance from the central axis decreases in the right direction, so that the direct acting rod 12 is permitted to move in the right direction to the fixing ring 11. Namely, the direct acting rod 12 moves in the right direction together with the vibration ring 7.

On the other hand, when the spherical surface portion 7b of the vibration ring 7 is moving in the left direction (during movement), the direct acting rod 12 can move in the right direction to the vibration ring 7 and cannot move in the left direction to the fixing ring 11 (by the wedge joint of the roller 15), so that the direct acting rod 12 stands still together with the fixing ring 11 and only the vibration ring 7 returns in the left direction.

After all, when the holding member 17 is at the position shown in FIG. 7, the direct acting rod 12 repeats an intermittent movement in the right direction (together with the rightward movement of the vibration ring 7) and even if one displacement is little, by accumulating it, can execute a direct motion at a sufficiently large stroke in the right direction.

FIG. 9 shows the state that power is supplied only to the coil (ii) 29. At this time, magnetic attraction force is acted on the disk 23 in the right direction and the slide member (i) 22 with the disk 23 fixed overcomes the leftward force of the pressing spring (vi) 30 by the rightward force which is the sum of the pressing force of the pressing spring (v) 24 and the concerned magnetic attraction force, thereby moves in the right direction. The slide member (i) 22 moves in the right direction until the disk 23 makes contact with the magnetic case (ii) 28. At this time, the axial position relationship between the holding member 17 connected via the connection pin 21 and the rollers is as shown in FIG. 10.

FIG. 10 shows the state that the holding member 17 moves in the right direction together with the slide member (i) 22, so that the rollers (i) 13 and (iii) 15 on the left of which the axial end face of the holding member 17 is located make contact with the holding member 17 and are pressed out in the right direction. Namely, the rollers (i) 13 and (iii) 15, even if pressed in the left direction by the pressing springs (i-iv) 19 and (iii) 20, are inhibited by the axial end face of the holding member 17, thereby cannot execute wedge joining. As a result, only wedge joining on the sections C-C (FIG. 3) and E-E (FIG. 5) shown in FIG. 9 can be realized. Further, the wedge joints on the sections C-C and E-E are wedge joints by the inclined surface in which the distance from the central axis decreases in the right direction of the shaft.

Next, the case that the vibration ring 7 fixed to the movable iron core 5 executes the alternating motion in the state shown in FIG. 9 by repeating power supply to the coil 4 and interruption thereof will be considered. When the spherical surface portion 7b of the vibration ring 7 is moving in the right direction (during movement), the inclined surface of the wedge joint in the cross sectional view C-C is an inclined surface in which the distance from the central axis decreases in the right direction, so that the direct acting rod 12 can move in the left direction to the vibration ring 7. The inclined surface of the wedge joint by the spherical surface portion 11b of the fixing ring 11 in the cross sectional view E-E is an inclined surface in which the distance from the central axis decreases in the right direction, so that the direct acting rod 12 cannot move in the right direction to the fixing ring 11. Namely, the direct acting rod 12 stands still together with the fixing ring 11 and only the vibration ring 7 moves in the right direction.

On the other hand, when the spherical surface portion 7b of the vibration ring 7 is moving in the left direction (during movement), the direct acting rod 12 cannot move in the right direction to the vibration ring 7 and can move in the left direction to the fixing ring 11, so that the direct acting rod 12 moves in the left direction together with the vibration ring 7 by the wedge connection action of the roller 14.

After all, when the holding member 17 is at the position shown in FIG. 9, the direct acting rod 12 repeats an intermittent movement in the left direction and even if one displacement is little, by accumulating it, can execute a direct motion at a sufficiently large stroke in the left direction.

In the structure of the first embodiment, the inclined surfaces of the wedge joining mechanism are all formed in the spherical surface portion 7b for executing only the alternating motion with a micro amplitude and the spherical surface portion 11b which is a fixed member, so that the mass of the wedge joint inhibition mechanism, holding member 17 which is a drive apparatus thereof, and coils (i) 26 and (ii) 29 does not move together with the direct acting rod 12. Further, in the wedge joining mechanism, the spherical surface portion 7b which is an alternating motion member and the spherical surface portion 11b fixed to the housing are arranged on the outer peripheral side of the direct acting rod 12, and the diameter of the direct acting rod 12 becomes smaller, thus the mass is reduced. By the structure and arrangement thereof, the inertia resistance as a linear actuator is reduced. Further, the holding member 17 which is a wedge joint inhibition mechanism does not move together with the movement of the direct acting rod 12, and the coils (i) 26 and (ii) 29 are fixed, thus the lead wires for supplying power to them will not be deformed in correspondence to the operation of the linear actuator.

Further, the inclined surface in contact with the roller (i) 13 and the inclined surface in contact with the roller (ii) 14 are surfaces inclined mutually in the reverse directions (in the structure shown in FIG. 1, the inclined surface facing the roller 13 is inclined so as to separate from the central axis in the right direction and the inclined surface facing the roller 14 is inclined so as to approach the central axis in the right direction) and the inclined surface in contact with the roller (iii) 15 and the inclined surface in contact with the roller (iv) 16 are also surfaces inclined mutually in the reverse directions. The inclined surfaces have respectively two kinds of inclined surfaces, so that the inclined surface for forming a wedge joint can be selected and switched, thus the direct acting rod 12 can be moved directly in both directions by switching the direct acting direction.

Further, the wedge joint inhibition mechanism included in each wedge joining mechanism is operated by the holding member 17 moving in the common direction such as the axial direction (the direct acting rod 12 or output shaft 31), so that the holding member 17 can serve as a holding member of a plurality of wedge joint inhibition mechanisms. Actually, holding members of a plurality of wedge joint inhibition mechanisms are united as a single holding member 17, and in correspondence with it, regarding the slide member (i) 22, disk 23, pressing spring (v) 24, magnetic case (i) 25, coil (i) 26, slide member (ii) 27, magnetic case (ii) 28, coil (ii) 29, and pressing spring (vi) 30 which compose the drive apparatus of the holding member 17, one set is enough, thus the number of components is reduced. In the first embodiment, although there are 12 components provided, which is equal to the total 12 of the rollers (i) 13, (ii) 14, (iii) 15, and (iv) 16 in which the wedge joint portion is a wedge member, regarding the holding member 17 of the wedge joint inhibition mechanism thereof and drive apparatus thereof, only one set each is enough.

Further, the rollers (i) 13, (ii) 14, (iii) 15, and (iv) 16 which are wedge members of the first embodiment are respectively a set of three rollers arranged in the circumferential direction, though each set is structured so as to make contact with the common spherical surfaces continuous in the circumferential direction such as the spherical surface portion 7b or 11b, so that there is no need to form inclined surface of the number of wedge members arranged in the circumferential direction.

Furthermore, the spherical surface portion 7b serves as two kinds of inclined surfaces inclined in the reverse directions such as the inclined surfaces corresponding to the set of the roller (i) 13 and the inclined surfaces corresponding to the set of the roller (ii) 14 and the inclined surfaces corresponding to six wedge members in total are formed by one spherical surface. The same may be said with the spherical surface portion 11b corresponding to the set of the roller (iii) 15 and the set of the roller (iv) 16.

Further, the contour of the outer peripheral surface of each of the rollers (i) 13, (ii) 14, (iii) 15, and (iv) 16 which are wedge members is formed at the curvature of the great circle of the spherical surface portion 7b or 11b, and the concave groove 12a (refer to FIGS. 1 and 2) of the direct acting rod 12 in contact with each roller is also formed at the same curvature, so that at time of wedge joining, all the sections make line contact with each other. The so-called Hertz stress is relaxed.

The first embodiment is not a system of creating a direct motion via the fluid pressure, so that it is free of necessity of maintenance due to leakage of hydraulic oil and restrictions on the environment and by use of the aforementioned constitution, furthermore, the mass executing the direct motion together with the output member is reduced, thus the effect of high-speed response can be withdrawn more. Further, the number of components and the processing man-hour are reduced and low cost can be realized. Furthermore, the repetitive deformation of the lead wires is avoided, and the Hertz stress of the inter-part contacting parts is relaxed, thus the life span thereof can be lengthened. As a result, a practicable high-performance linear actuator can be provided.

[Second Embodiment]

Figure 11:
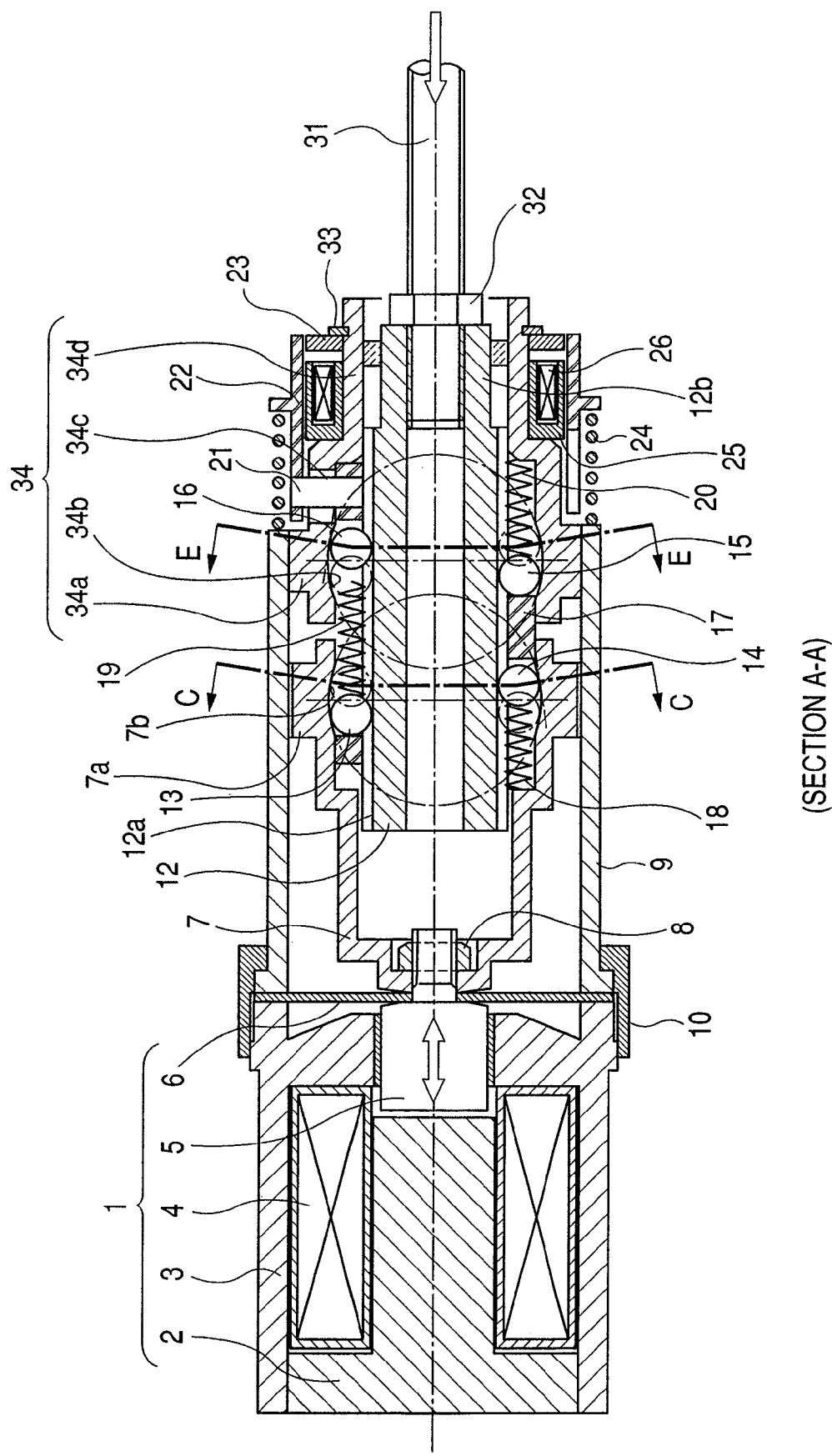
FIG. 11 is a cross sectional view in the axial direction of the linear actuator relating to the second embodiment of the present invention when the output shaft thereof is driven in the left direction in the drawing.

The linear actuator relating to the second embodiment of the present invention will be explained below by referring to FIG. 11. FIG. 11 is a cross sectional view in the axial direction of the linear actuator relating to the second embodiment when the output shaft thereof is driven in the left direction in the drawing.

In FIG. 11, in the second embodiment, the slide member (ii) 27, magnetic case (ii) 28, coil (ii) 29, and pressing spring (vi) 30 in the first embodiment are not used and instead, a stopper 33 for controlling the rightward movement of the slide member (i) 22 and disk 23 which are united is incorporated. As a result, the holding member 17 moves in the left or right direction depending on whether power is supplied to the coil (i) 26 or not, enters the state shown in FIG. 8 or 10, and does not enter the state of the neutral position shown in FIG. 6. Namely, when the coil 26 is turned on, the holding member 17 enters the same state (the output shaft moves in the right direction) as that shown in FIG. 8 and when the coil 26 is turned off, the holding member 17 enters the same state (the output shaft moves in the left direction) as that shown in FIG. 10.

In the case of a one-way load instead of an alternating load that external force acting on the output shaft 31 when the linear actuator is stopped is changed left and right, also in the second embodiment, either of the states shown in FIGS. 8 and 10 is selected and the output shaft 31 can be prevented from moving by external force, so that the constitution can be simplified. When driving left and right the output shaft 31, similarly to the first embodiment, it is desirable to put the holding member 17 into the state shown in FIG. 8 or 10 and start the alternating drive apparatus 1.

[Third Embodiment]

Figure 12:
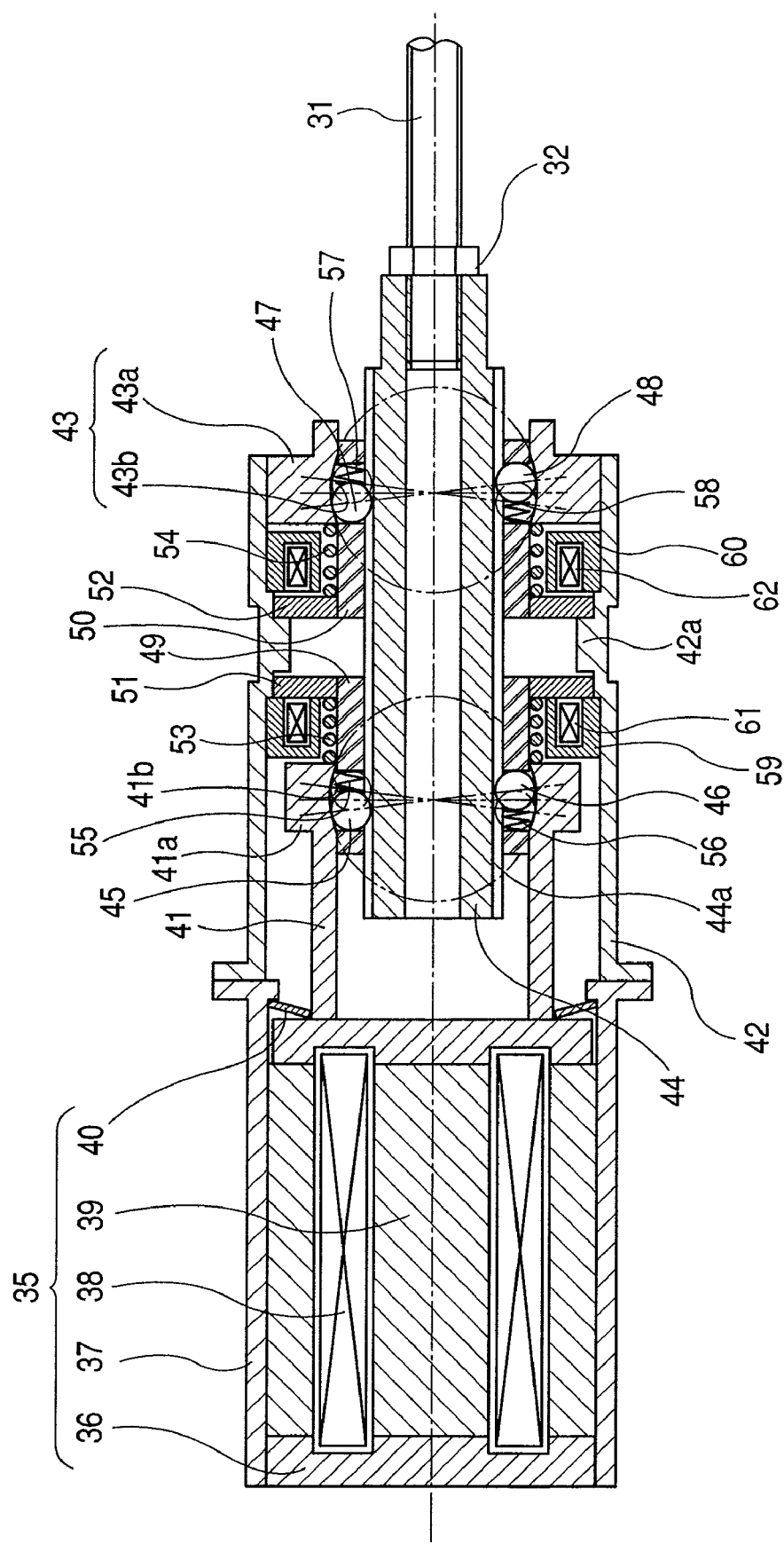
FIG. 12 is a cross sectional view in the axial direction of the linear actuator relating to the third embodiment of the present invention.
Figure 13:
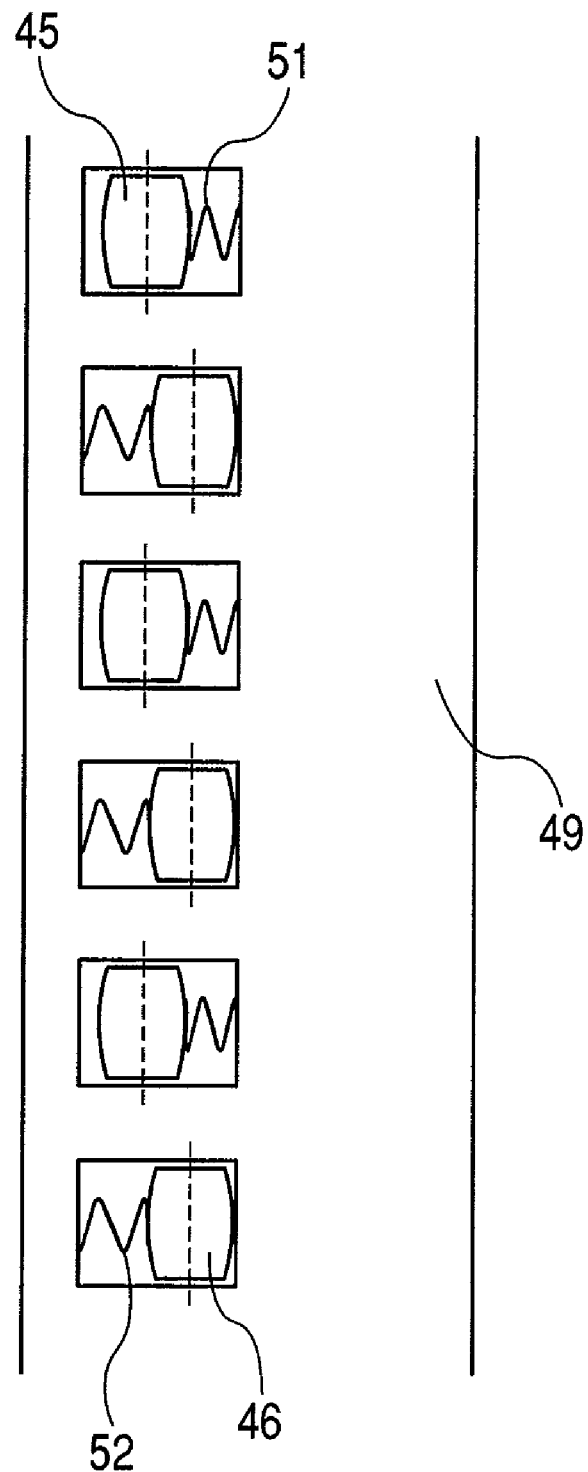
FIG. 13 is a drawing of one of the two wedge joining mechanisms of the linear actuator arranged in the circumferential direction shown in FIG. 12 which is developed on a plane.
Figure 14:
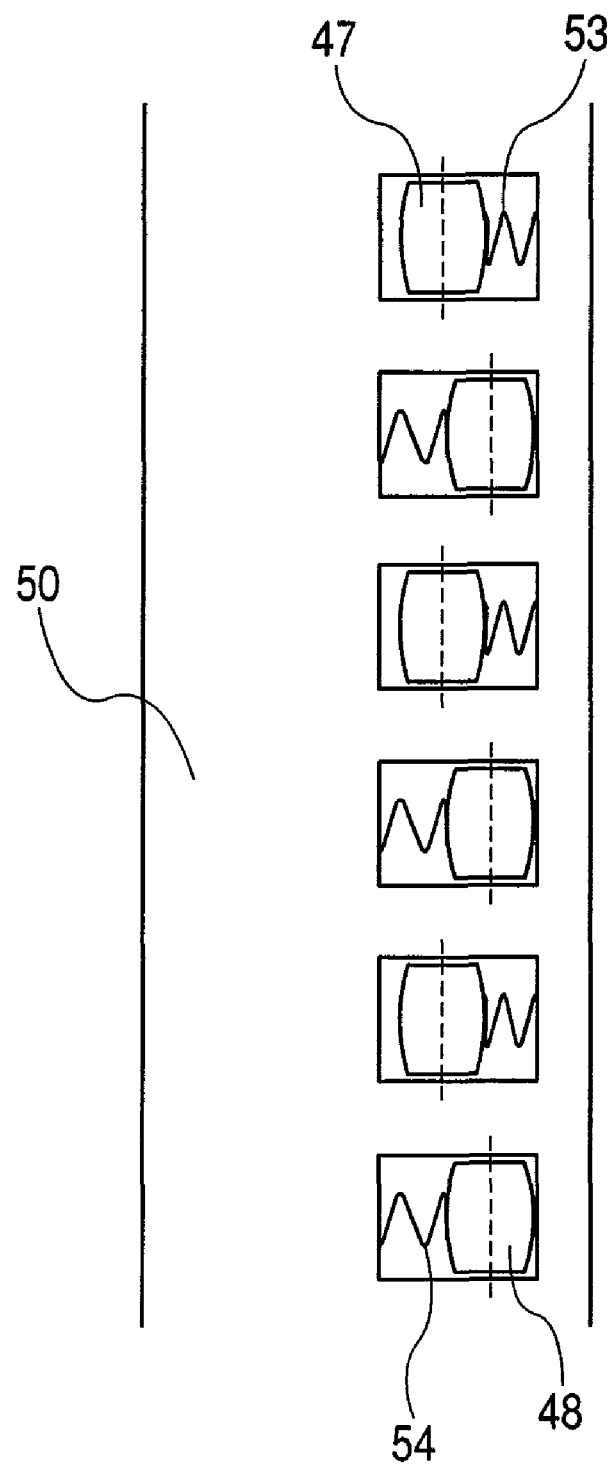
FIG. 14 is a drawing of the other one of the two wedge joining mechanisms of the linear actuator arranged in the circumferential direction shown in FIG. 12 which is developed on a plane.

The linear actuator relating to the third embodiment of the present invention will be explained in detail below by referring to FIGS. 12, 13, and 14. FIG. 12 is a cross sectional view in the axial direction of the linear actuator relating to the third embodiment. FIG. 13 is a drawing of one of the two wedge joining mechanisms arranged in the circumferential direction shown in FIG. 12 which is developed on a plane. FIG. 14 is a drawing of the other one of the two wedge joining mechanisms arranged in the circumferential direction shown in FIG. 12 which is developed on a plane.

In the third embodiment, an alternating drive apparatus 35 is composed of a rear case 36, a case 37, a coil 38, a magnetostrictor 39, and a conical spring 40 and gives an alternating motion in the axial direction to a vibration ring 41 which is an alternating motion member. The magnetostrictor 39 is extended in the axial direction by a magnetic field generated by supplying power to the coil 38, drives the vibration ring 41 in the right direction, and when the power supply is interrupted, is contracted to the original size due to disappearance of the magnetic field. At that time, the vibration ring 41 is driven in the left direction by the conical spring 40. When repeating the power supply and interruption for the coil 38 like this, the vibration ring 41 is driven back and forth in the axial direction. According to the present invention, as an alternating drive apparatus, various forms can be applied and it is possible to use the solenoid in the first embodiment, the magnetostrictor in the second embodiment, and furthermore, a magnetostrictor changing its dimensions due to impression of a voltage like a piezo-electric element.

Further, in the third embodiment, unlike the first and second embodiments, a holding member (i) 49 of the first wedge joining mechanism and a holding member (ii) 50 of the second wedge joining mechanism are different members and magnetic disks (i) 51 and (ii) 52 are fixed integrally with each of them. Further, the holding members are respectively pressed by pressing springs (xi) 53 and (xii) 54 in the right direction and left direction in the drawing. Both holding members can move in the axial direction by the pressing springs until the disks (i) 51 and (ii) 52 make contact with a projection 42*a* on the inner peripheral side of a housing 42. On the left and right of the disks (i) 51 and (ii) 52, a magnetic case (iii) 59 and a magnetic case (iv) 60 are fixed respectively and in each magnetic case, a coil (iii) 61 and a coil (iv) 62 are fixed.

When power is supplied to the coil (iii) 61, it can attract the disk (i) 51 in the left direction and when power is supplied to the coil (iv) 62, it can attract the disk (ii) 52 in the right direction. In FIG. 12, power is supplied only to the coil (iii) 61 among them, and the holding member (i) 49 is attracted in the left direction by the magnetic force together with the disk (i) 51, and the holding member (ii) 50 is pressed in the left direction by a pressing spring (xii) 54 together with the disk (ii) 52.

FIGS. 13 and 14 show drawings of the holding members (i) 49 and (ii) 50 which are developed respectively on a plane. Among rollers (v) 45, rollers (vi) 46, rollers (vii) 47, and rollers (viii) 48 which are arranged respectively in three pieces on circumferences at different axial positions, the rollers (vi) 46 and (viii) 48 on the right of which the axial end faces of the holding members 49 and 50 are adjacent are pressed out by the leftward movement of the holding members (i) 49 and (ii) 50 and cannot be wedge-joined. In the first and second wedge joining mechanisms, the state that only the residual rollers (v) 45 and (vii) 47 can be wedge-joined, in the first embodiment, is the state shown in FIG. 7 or 8 and by the principle and operation explained in the first embodiment, the direct acting rod 44 and output shaft 31 are driven in the right direction in the drawing by the alternating drive apparatus 35. When intending to drive them in the left direction, it is desirable to supply power inversely only to the coil (iv) 62.

Further, the holding member (i) 49 of the third embodiment is a common holding member in which a holding member for inhibiting wedge-joining including the roller (v) 45 and a holding member for inhibiting wedge-joining including the roller (vi) 46 are united and the holding member (ii) 50 is a common holding member in which a holding member for inhibiting wedge-joining including the roller (vii) 47 and a holding member for inhibiting wedge-joining including the roller (viii) 48 are united. In this connection, the first embodiment unites furthermore these common holding members.

In the third embodiment, by uniting even if partially, the number of holding members and the number of components for driving them can be reduced to a certain extent. Further, as a peculiar effect of the third embodiment, by supplying no power to both coils (iii) 61 and (iv) 62 or supplying power to both of them, a state that the wedge joint by the inclined surfaces in the reverse directions functions (when the coils 61 and 62 are supplied or not supplied with power, the direct acting rod 44 cannot move in any direction) is realized and even if the mechanism for holding the holding member at the neutral position (the stop position shown in FIG. 1) as described in the first embodiment is not provided, the output shaft 31 can be fixed for external force changing due to alternation when the linear actuator is stopped.

As explained above, the main characteristic of the linear actuator relating to the embodiments of the present invention is a one created to solve the following problem of the prior art and produces a peculiar effect which cannot be obtained by the prior art. Namely, in the conventional linear actuator for accumulating the one-way motion of the alternating motion by the alternating drive source and creating a direct motion, a problem arises that the mass of the portion for executing the direct motion is increased, and the inertia resistance is increased, thus improvement of the response speed is inhibited and furthermore, a problem of durability arises that the drive apparatus for the function of switching the direct acting direction moves, so that the power supply route such as the lead wire is deformed frequently. Further, the prior art has many wedge joining mechanisms and in correspondence to them, many wedge joint inhibition mechanisms and drive apparatus thereof are required and a problem arises that the number of components and the processing man-hour of the inclined surfaces of the wedge joining mechanisms are increased, thus an increase in cost is caused.

Therefore, in the embodiments of the present invention, in the linear actuator for accumulating the one-way motion of the alternating motion by the alternating drive source and creating a direct motion, to realize high-speed response, decrease in cost, and long life span by reduction in the mass of direct acting portions, reduction in the numbers of components and processing steps, and reduction in the contact surface pressure is assumed as a main object of problem solution. And, as a concrete measure for solving the problems, a constitution that the inclined surfaces of the wedge joining mechanisms are not formed on the direct acting member side is used, and the mass of the wedge joint inhibition mechanisms and drive apparatuses thereof is not added to the mass of the portion for executing the direct motion, and furthermore, in all the wedge joining mechanisms, the direct acting members are arranged on the inner peripheral side, and the mass thereof is reduced, thus the inertia resistance is reduced. Further, the drive apparatuses for the wedge joint inhibition mechanisms are fixed, thus the lead wires are not deformed.

Furthermore, a constitution that the holding members which are components of the wedge joint inhibition mechanisms included in each wedge joining mechanism can be united is used, thus the number of components is reduced and in correspondence with it, the number of drive apparatuses thereof is reduced. Further, a plurality of inclined surfaces necessary for each wedge joining mechanism are formed as a part of the common spherical surface, thus the processing man-hour is reduced. In correspondence with that the inclined surfaces are formed as a spherical surface, the wedge members in contact with it are formed in a shape of making line contact with the spherical surface and furthermore, the contact portions with the wedge members of non-inclined members are formed in a shape for making line contact. Therefore, the inclined surfaces can be avoided from reduction in the fatigue life due to large stress generated by point contact.

The action and effect of the linear actuator relating to the embodiments of the present invention will be explained more below. Namely, in the mechanism for generating a direct motion of the direct acting members from the alternating motion of the alternating motion members using the wedge joining mechanism, the inclined surfaces of the wedge joining mechanism are never formed on the direct acting members but are formed on the fixing members fixed to the housing member and the alternating motion members for executing only the alternating motion with a micro amplitude. In consideration of the case that the wedge joint inhibition mechanism for inhibiting wedge joining of the wedge joining mechanism is mounted, the wedge joint inhibition mechanism must be fixed for the inclined surface surely existing on the wedge joint portion instead of the non-inclined surface moving in the axial direction for the wedge joint portion.

In this embodiment, in the direct acting members having no inclined surfaces formed, there is no need to mount the drive apparatuses such as the wedge joint inhibition mechanism and solenoid for driving it and the mass of the portion for executing the direct motion as output can be prevented from increasing. Therefore, the inertia resistance when functioning as a linear actuator is reduced, thus a high-speed response is enabled. Further, the drive apparatuses of the wedge joint inhibition mechanism can be mounted on the fixing members, so that when supplying power to them via lead wires, the stress due to deformation in correspondence with the operation of the actuator will not act repeatedly and the durability thereof can be ensured.

Further, according to this embodiment, the direct acting members which are output members are arranged in the neighborhood of the central axis in the overall constitution of the actuator, thereby can be stored within a range at a small diameter from the central axis. Therefore, the mass of the direct acting members themselves can be made smaller, so that the inertia resistance when functioning as a linear actuator is reduced, thus a higher-speed response is enabled.

Further, according to this embodiment, the inclined surface for forming a wedge joint can be selected and switched from the two kinds of forward and backward inclined surfaces, so that the direct acting direction influenced by the inclination direction of the inclined surface of the wedge joint is switched, thus the direct acting member can be acted directly in both directions. Furthermore, each holding member for the operation of each wedge joint inhibition mechanism is operated by moving in the common axial direction, so that the holding members can be united. Furthermore, the holding member for inhibiting contact of the forward inclined surface with the wedge member and the holding member for inhibiting contact of the backward inclined surface with the wedge member are united, thus the number of components is reduced, and furthermore, they can be driven by the common holding member drive mechanism, so that the cost of the linear actuator can be decreased.

Further, according to this embodiment, one holding member of the linear actuator and one holding member drive mechanism thereof are enough, so that the cost of the linear actuator can be decreased more. Furthermore, there is no need to form inclined surfaces for wedge joining for a plurality of wedge members arranged in the circumferential direction and one spherical surface continuous on the overall circumference is just formed. Furthermore, the spherical surface itself is formed in a rotator shape and an easily processed shape, so that the cost of the linear actuator can be decreased.

Further, according to this embodiment, the forward inclined surface and backward inclined surface do not need to be formed as separate inclined surfaces and can be formed by a common inner peripheral spherical surface, so that the cost of the linear actuator can be decreased more. Furthermore, to decrease the cost, even if the inclined surfaces are formed by a spherical surface continuous in the circumferential direction, the contacting part of the wedge member with the inclined surface and the contacting part of the wedge member with the non-inclined surface can be formed as a line contact instead of a point contact and the material fatigue progressed by the Hertz stress generated at the contacting part is relaxed and the flaking life can be lengthened.

[Fourth Embodiment]

Figure 15:
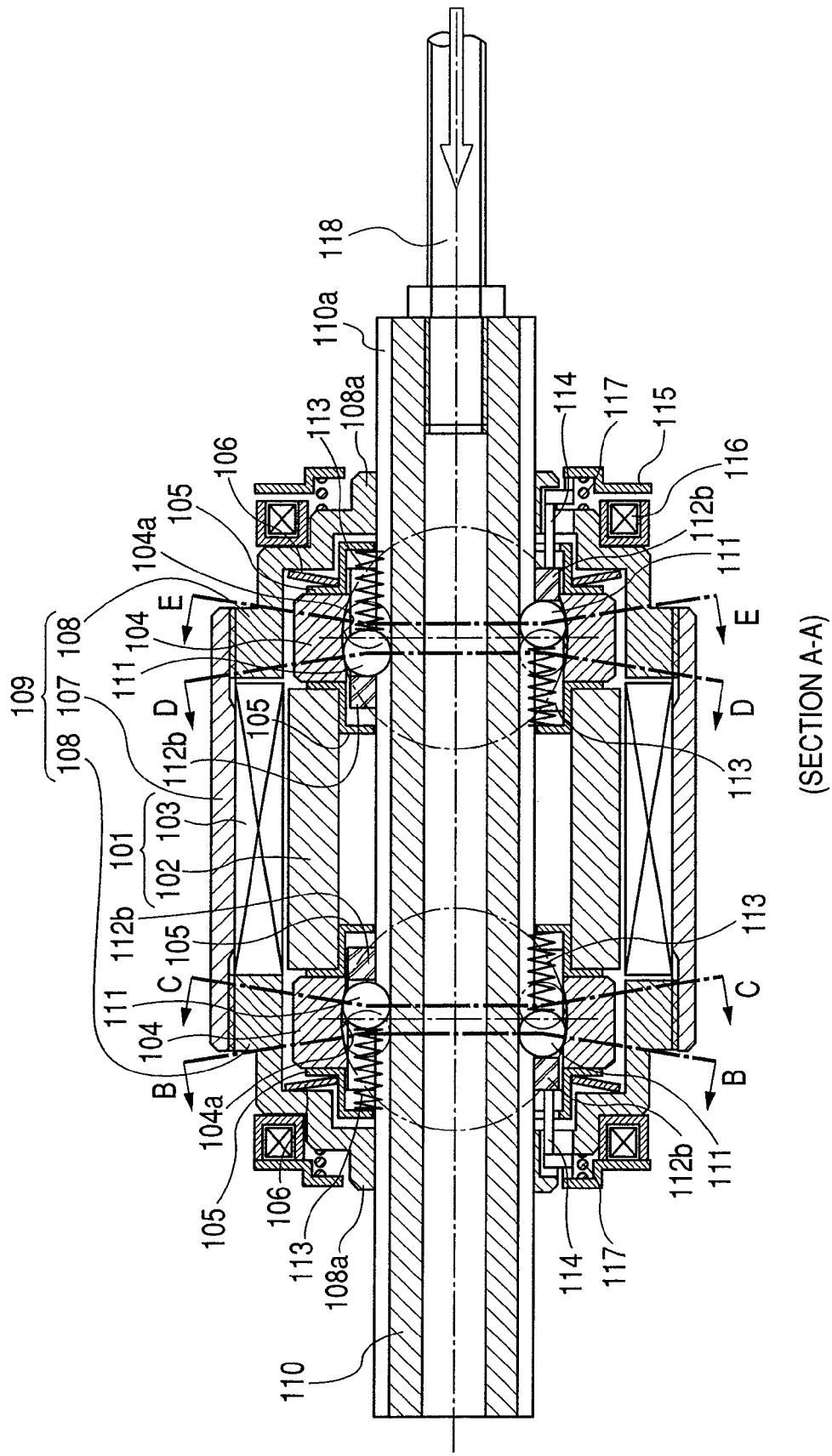
FIG. 15 is a cross sectional view in the axial direction of the linear actuator relating to the fourth embodiment of the present invention.
Figure 16:
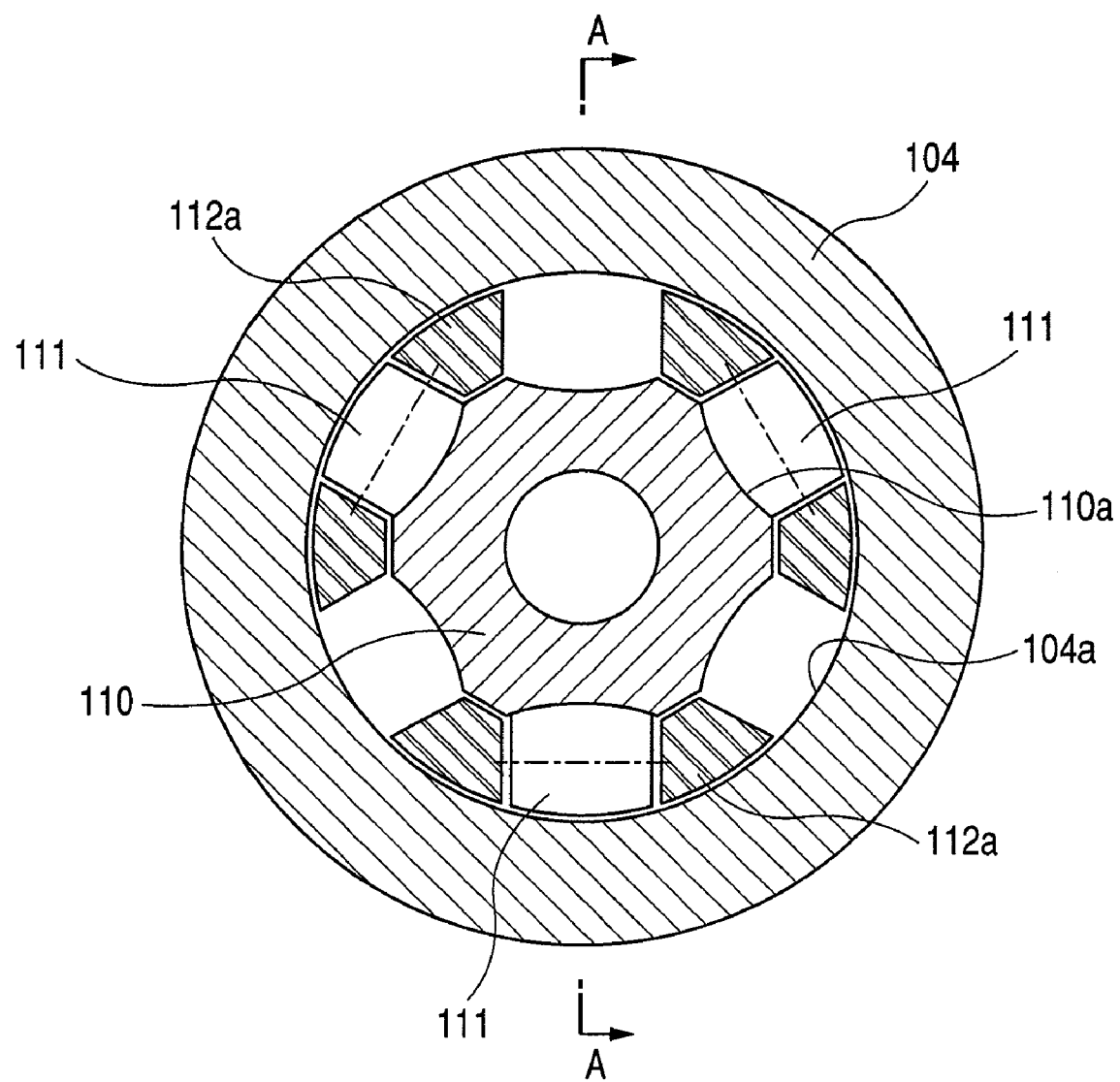
FIG. 16 is a transverse cross sectional view showing the sections B-B and E-E of the linear actuator relating to the fourth embodiment of the present invention shown in FIG. 15.
Figure 17:
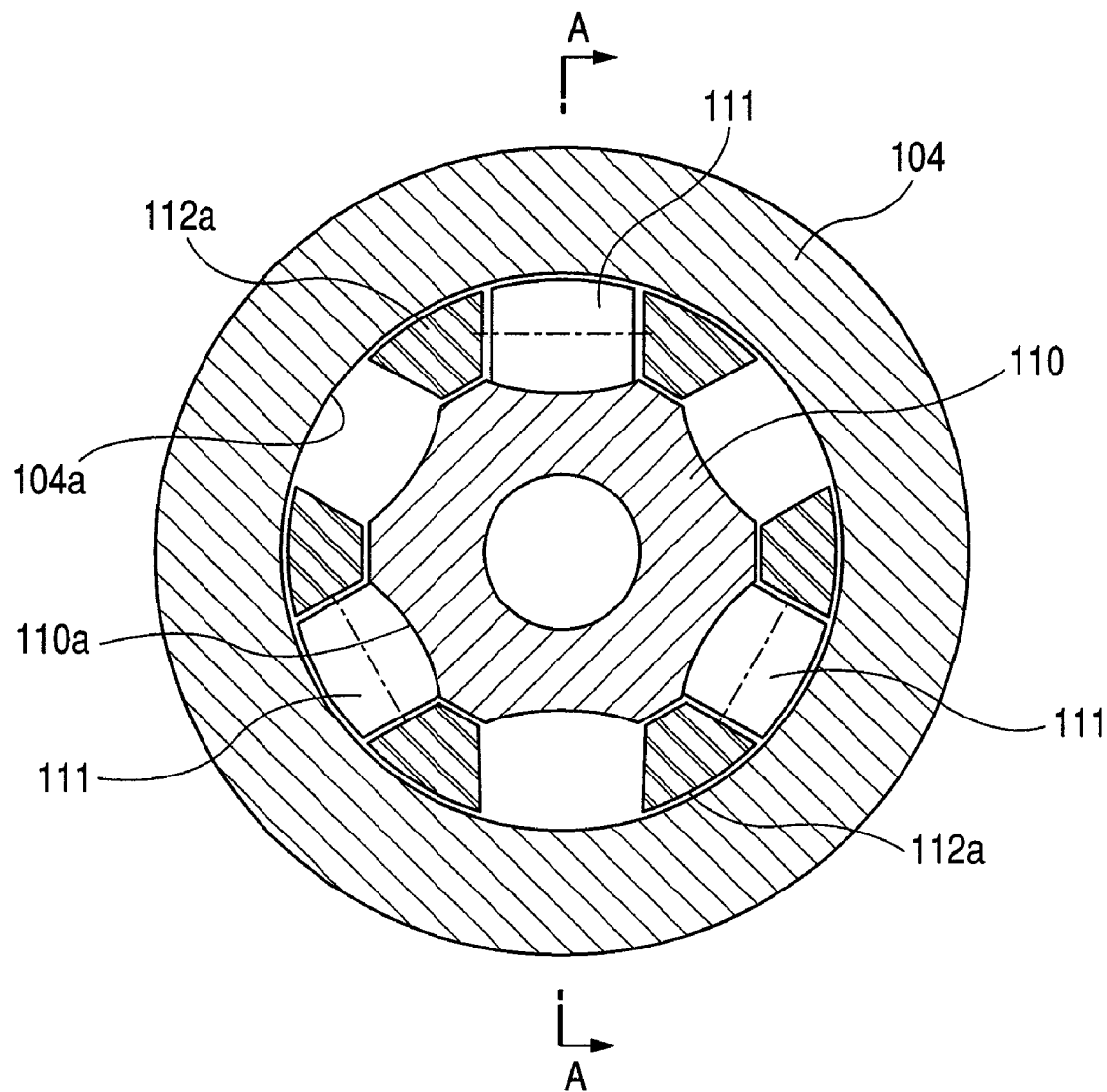
FIG. 17 is a transverse cross sectional view to show the sections C-C and D-D of the linear actuator relating to the fourth embodiment of the present invention shown in FIG. 15.
Figure 18:
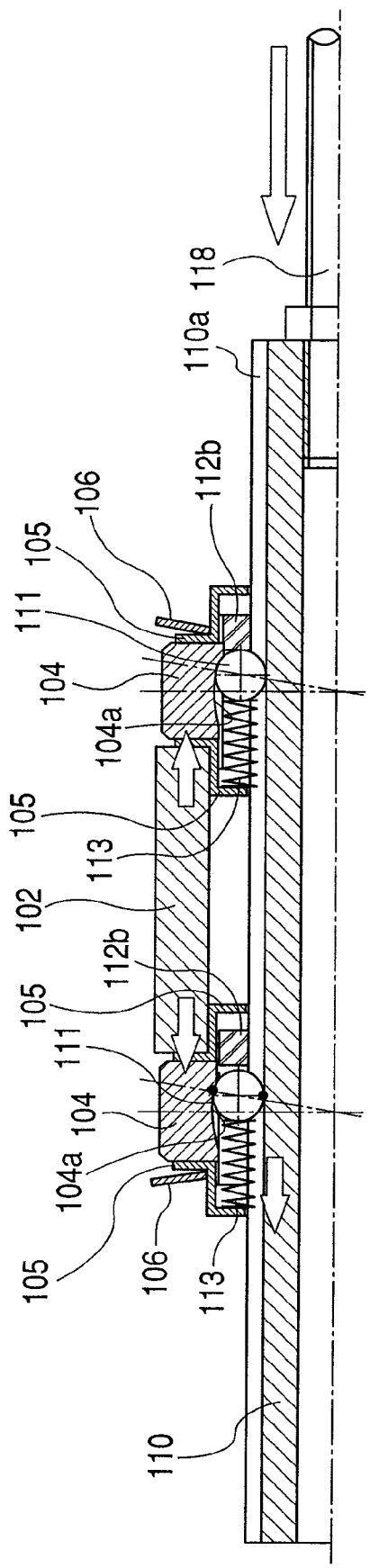
FIG. 18 is a drawing to show a principle of driving the output shaft when the distance in the axial direction between the joint members is increased in the linear actuator relating to the fourth embodiment of the present invention shown in FIG. 15.
Figure 19:
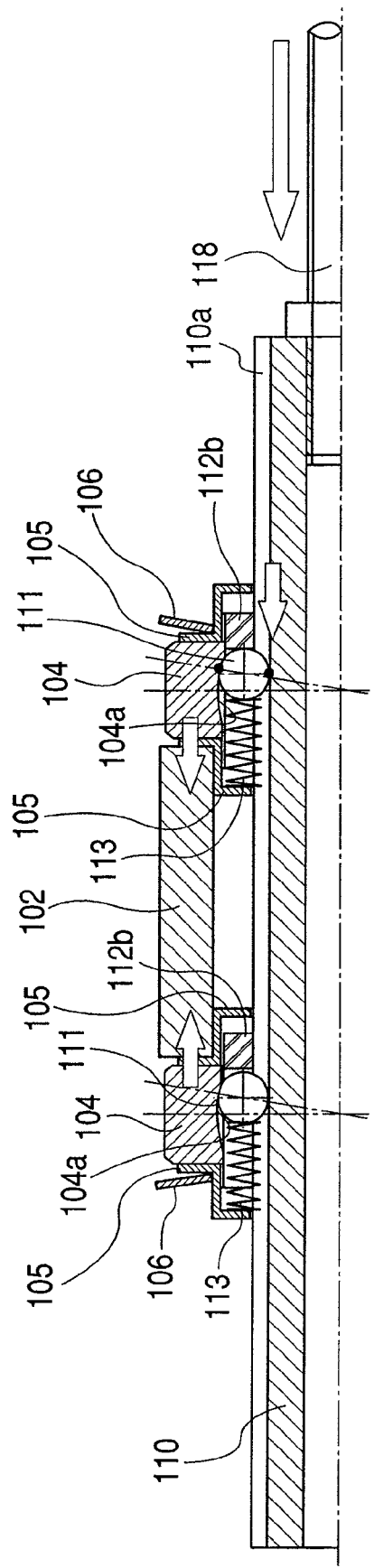
FIG. 19 is a drawing showing the principle of driving the output shaft when the distance in the axial direction between the joint members is decreased in the linear actuator relating to the fourth embodiment of the present invention shown in FIG. 15.

Hereinafter, the linear actuator relating to the fourth embodiment will be explained by referring to FIGS. 15 to 19. FIG. 15 is a cross sectional view in the axial direction of the linear actuator, which is a drawing showing the section A-A shown in FIGS. 16 and 17. FIG. 16 is a transverse cross sectional view of the linear actuator to show the sections B-B and E-E shown in FIG. 15 and FIG. 17 is a transverse cross sectional view of the linear actuator to show the sections C-C and D-D shown in FIG. 15. FIG. 18 is a drawing to show a principle of driving the output shaft when the distance in the axial direction between the two joint members is increased in the linear actuator shown in FIG. 15 and FIG. 19 is a drawing to show a principle of driving the output shaft when the distance in the axial direction between the two joint members is decreased in the linear actuator shown in FIG. 15.

In FIG. 15, an alternating drive apparatus 101 is composed of a magnetostrictor 102 and a coil 103. On both sides of the magnetostrictor 102 in the axial direction, two joint members 104 are closely adhered respectively via a spring holder 105. Outside each of the joint members 104, the spring holder 105 is also adhered closely and furthermore, outside it, a conical spring 106 which is a pressing member in the axial direction is arranged. These components are adhered closely to each other in the axial direction and are held and incorporated in the axial direction in a housing 109 composed of a casing 107 and two side ends 108. The two joint members 104 equivalent to a first joint member and a second joint member can slide respectively on the adhered surfaces with the adjacent components. Therefore, they are not fixed in the radial direction. Further, the two joint members 104 can execute respectively the alternating motion in the axial direction by expansion and contraction of the magnetostrictor 102 of the alternating drive apparatus 101 and serve as a first alternating motion member and a second alternating motion member.

In the two side ends 108, shaft support portions 108a having an inner peripheral cylindrical surface are formed and here, a direct acting member 110 having the sectional shape shown in FIGS. 16 and 17 is restricted in the radial direction and is supported so as to move in the axial direction. The direct acting member 110 has no article for blocking the axial direction, thereby moves through the two side ends 108.

In the joint members 104 serving as the first alternating motion member and second alternating motion member, an inner peripheral spherical surface portion 104a is formed and in the direct acting member 110, a concave groove 110a is formed. And, between the two surfaces, a roller 111 which is a wedge member for wedge joining is arranged. The wedge joint is formed by a surface inclined in the axial direction (inclined surface), a surface not inclined in the axial direction (non-inclined surface), and a wedge member, though the non-inclined surfaces in this embodiment are all fixed to the direct acting member 110 as a concave groove 110a and the inclined surfaces are fixed to the joint members 104 serving as the first alternating motion member and second alternating motion member as an inner peripheral spherical surface portion 104a.

The radius of curvature of the section perpendicular to the axis (FIGS. 16, 17) of the concave groove 110a is equal to the radius of the great circle of the inner peripheral spherical surface portion 104a and the roller 111, since the contour of the outer peripheral part thereof is formed by the concerned radius, can make contact with any wedge-joining surface in a line contact form. The roller 111 plays a roll that at each of the sections B-B, C-C, D-D, and E-E shown in FIG. 15, three pieces are incorporated in the circumferential direction and guide portions 112a of a holding member 112 shown in FIGS. 16 and 17 arrange the three rollers 111 at predetermined intervals in the circumferential direction. In the holding member 112, notches for inserting the rollers 111 from one end of the cylindrical member in the axial direction are formed at three locations and between the notches, notches for inserting the rollers 111 at different three locations from the other end thereof in the axial direction are formed. As a result, two adjacent guide portions 112a at the six locations of each of the holding members 112 are connected by connection portions 112b shown in FIG. 15 and are united as a whole.

To the connection portions 112b arranged outside each of the holding members 112, disks 115 composed of a magnetic substance are connected via a connection pin 114. Opposite to the inner side wall of each of the disks 115, coil portion assemblies 116 composed of a coil and a U-shaped magnetic substance are fixed. The left and right disks 115 are pressed externally by springs 117 incorporated between the side ends 108 and themselves and when power is supplied to the coil portion assemblies 116, are attracted inside by the magnetic attraction force. The movement, when outward, is restricted due to contact of the side ends 108 with the connection pins 114 and when inward, is restricted due to contact of the disks 115 with the coil portion assemblies 116.

Between the spring holder 105 and each of the rollers 111, a pressing spring 113 is incorporated and presses each of the rollers 111 toward the connection portion 112b of the holding member 112. If each of the rollers 111 is held between the inner peripheral spherical surface portion 104a and the concave groove 110a by the pressing force before it makes contact with the connection portion 112b, wedge joining is realized and if it makes earlier contact with the connection portion 112b, the wedge joining is inhibited. Further, depending on the dimensional relationship between the portions, at time of wedge joining, each of the rollers 111 and the inner peripheral spherical surface portion 104a make surely contact with each other at a position shifted in the axial direction from the spherical center of the inner peripheral spherical surface portion 104a such as the sections B-B, C-C, D-D, and E-E. Therefore, the tangential direction at the contact point shown in FIG. 15 is inclined surely with the axial direction and the inner peripheral spherical surface portion 104a becomes an inclined surface. On the other hand, the concave groove 110a is always parallel with the axial direction and becomes a non-inclined surface.

In FIG. 15, the coil portion assembly 116 on the right is not supplied with power and the holding members 112 on the right move respectively rightward by the springs 117. On the other hand, the coil portion assembly 116 on the left is supplied with power and the holding members 112 on the left, since the disks 115 are attracted by the coil portion assembly 116, move also rightward. As a result, the rollers 111 at the sections B-B and D-D are pressed out by the connection portions 112b and are put into the state that wedge joining is inhibited, and the rollers 111 at the sections C-C and E-E move away from the connection portions 112b and are put into the state that wedge joining can be realized surely.

Next, the principle that the alternating motion generated by the alternating drive apparatus 101 is converted to a one-way direct motion will be explained by referring to FIGS. 18 and 19. In FIGS. 18 and 19, only the parts directly relating to the conversion principle from the alternating motion to the direct motion are shown.

Further, the rollers 111 at the sections B-B and D-D that the wedge joining is inhibited in FIG. 15 are omitted and only the rollers 111 at the sections C-C and E-E that the wedge joining is enabled are shown. Further, as shown in FIGS. 15 to 17, the roller 111 at the section C-C and the roller 111 at the section E-E are arranged at shifted positions in the circumferential direction, and the rollers 111 are not originally illustrated simultaneously on the sections shown in FIGS. 18 and 19, though for explanation of the principle of realization of direct action, they are illustrated on the same section for convenience.

FIG. 18 shows the state that by power supply to the coil 103 of the alternating drive apparatus 101, the shaft length of the magnetostrictor 102 is extended and the joint members 104 respectively move externally. At this time, in the inner peripheral spherical surface portion 104a on the right, roller 111, and concave groove 110a, no wedge joint is formed in the motion direction of the joint member 104 to the direct acting member 110, though in the inner peripheral spherical surface portion 104a on the left, roller 111, and concave groove 110a, a wedge joint is formed, thus the direct acting member 110 is driven in the left direction in the drawing. FIG. 19 shows the state that the power supply to the coil 103 of the alternating drive apparatus 101 is interrupted, and the shaft length of the magnetostrictor 102 is contracted, and the joint members 104 respectively move internally by the conical springs 106. At this time, in the inner peripheral spherical surface portion 104a on the left, roller 111, and concave groove 110a, no wedge joint is formed in the motion direction of the joint member 104 to the direct acting member 110, though in the inner peripheral spherical surface portion 104a on the right, roller 111, and concave groove 110a, a wedge joint is formed, thus the direct acting member 110 is driven also in the left direction in the drawing. After all, even when the shaft length of the magnetostrictor 102 is extended or contracted, the direct acting member 110 and output shaft 118 fixed to it are driven in the left direction and can execute a comparatively smooth direct motion.

Unlike FIG. 15, the case that the coil portion assembly 116 on the right is supplied with power, and the holding members 112 on the right are moved leftward by the magnetic attraction force of the disk 115 and the coil portion assembly 116, and the coil portion assembly 116 on the left is not supplied with power, and the holding members 112 on the left are also moved leftward by the springs 117 will be considered. In this case, the rollers 111 at the sections C-C and E-E are pressed out by the connection portions 112b and are put into the state that wedge joining is inhibited, and the rollers 111 at the sections B-B and D-D move away from the connection portions 112b and are put into the state that wedge joining can be realized surely. The parts directly relating to the conversion principle from the alternating motion to the direct motion at that time, in FIGS. 18 and 19, are put into the state that the parts other than the output shaft 118 are inverted left and right. At this time, when the shaft length of the magnetostrictor 102 is extended or contracted, the direct acting member 110 and the output shaft 118 fixed to it are driven in the right direction and it can be analogized easily that they execute also a comparatively smooth direct motion.

As a result of this, a linear actuator capable of permitting the direct acting member 110 and output shaft 118 to execute the direct motion in the longitudinal direction can be structured.

[Fifth Embodiment]

Figure 20:
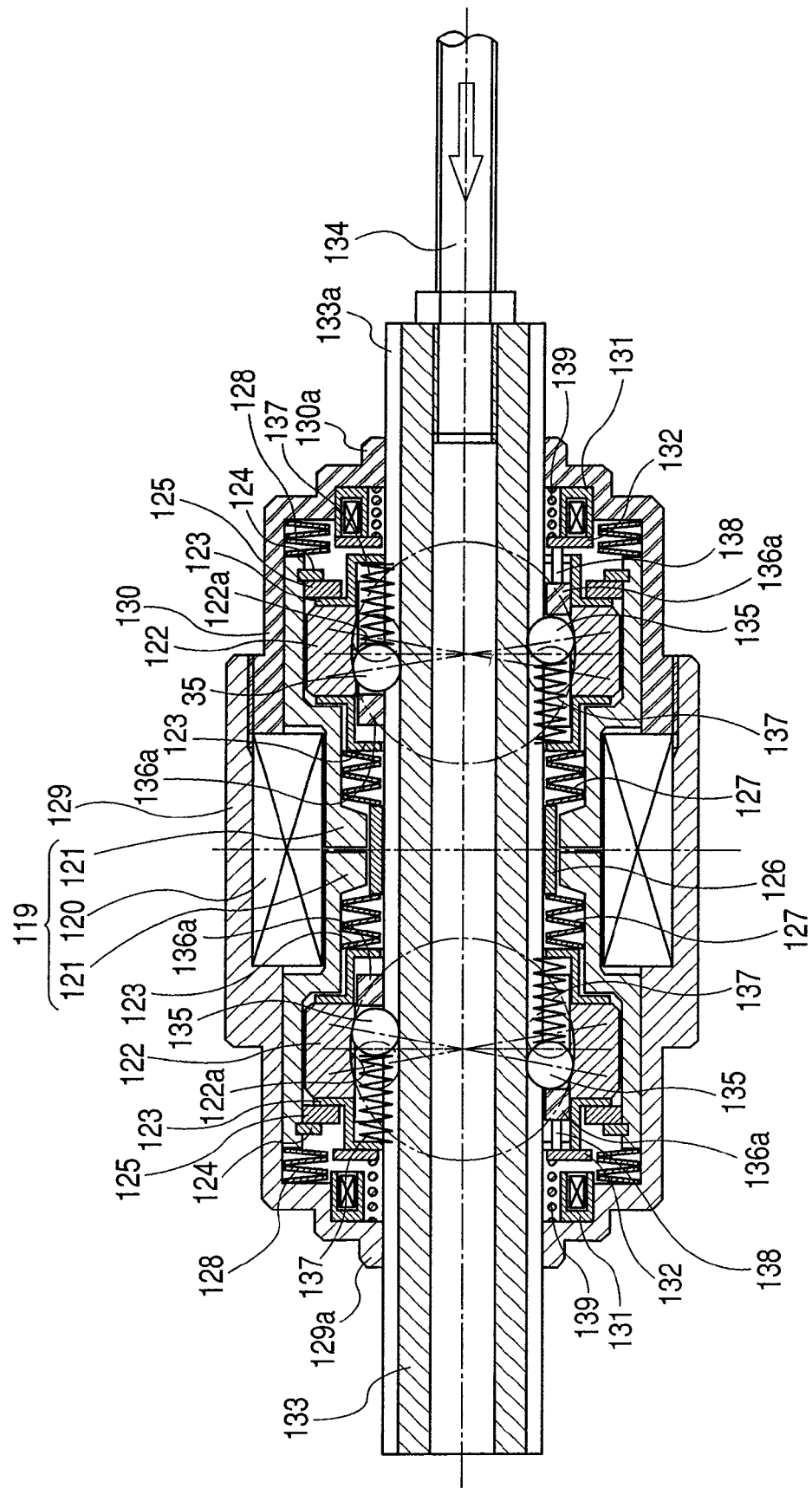
FIG. 20 is a cross sectional view in the axial direction of the linear actuator relating to the fifth embodiment of the present invention.

Hereinafter, the linear actuator relating to the fifth embodiment will be explained by referring to FIG. 20. FIG. 20 is a cross sectional view in the axial direction of the linear actuator relating to the fifth embodiment.

In this embodiment, an alternating drive apparatus 119 is composed of a coil 120 and two movable iron cores 121. The two movable iron cores 121, when at least the coil 120 is not supplied with power, are arranged in the axial direction opposite to each other in the state that there is a gap at the central part. On the inner peripheral part of each of the movable iron cores 121, a joint member 122 and spring holders 123 on both sides thereof are arranged and are restricted on movement outside the axial direction to each of the movable iron cores 121 by an E ring 124 and a washer 125. This movement restriction section is always kept in the joined state by a spacer 12 and a conical spring (i) 127 which are arranged at the central part. The left and right movable iron cores 121 are additionally held and incorporated between a housing (i) 129 and a housing (ii) 130, which are made of a magnetic substance, in the axial direction via a conical spring (ii) 128. The gap aforementioned is set at a predetermined gap by adjusting the spring force acted by the conical springs (i) 127 and (ii) 128.

When the coil 120 is supplied with power, the two movable iron cores 121 attract each other, slide to the housing (i) 129 or (ii) 130, and move toward the center to reduce the gap. At that time, the movable iron cores permit the left and right joint members 122 to move together to reduce the distance between the joint members 122 in the axial direction. When the power supply to the coil 120 is interrupted, the joint members 122 extend the axial distance thereof by the spring force of the conical spring (i) 127 and simultaneously recover the gap between the two movable iron cores 121. Namely, the fifth embodiment indicates that the axial distance between the left and right joint members 122 can be extended or contracted by the magnetic force. Further, each of the joint members 122 can slide on the joined surfaces with the neighboring components thereof, so that it is not fixed in the radial direction.

The principle and constitution of creating a direct motion in the longitudinal direction from the two joint members 122 the axial distance of which extends or contracts are the same as those of the fourth embodiment. However, coil portion assemblies 131 and disks 132 of the fifth embodiment are incorporated in the opposite left and right position relationship of that of the coil portion assemblies 116 and disks 115 of the fourth embodiment, so that the relationship between the direction in which a direct acting member 133 and an output shaft 134 are to be moved directly and the coil portion assembly 131 to be supplied with power among the two coil portion assemblies 131 is reverse to the relationship explained in the fourth embodiment.

As explained above, according to this embodiment, (1) the direct acting member 133 is supported in the radial direction by the shaft support portions 129a, 130a provided in the housing member, so that the radial load and moment acting on the direct acting member 133 from the outside can be supported by the shaft support portions 129a, 130a. Further, the first and second joint members 122 are structured so as not to be fixed in the radial direction, so that they will not support the radial load and moment acting on the direct acting member 133 from the outside. Namely, external force can be prevented from acting on the first and second wedge joining mechanisms incorporated between the first and second joining members 122 and the direct acting member 133. Further, when the first wedge joining mechanism or second wedge joining mechanism is put into the wedge joining state and a radial load is generated by a resultant force of the acting force of each wedge joint portion in each wedge joining mechanism, each joint member 122 moves in the radial direction and the radial load aforementioned is eliminated. Namely, the load due to wedge joining can be prevented from acting between each joint member 122 and the direct acting member 133. As a result of this, the credibility of the wedge joining mechanisms and shaft support portion can be enhanced.

(2) Both the first and second joint members 122 execute the alternating motion. Therefore, in all the cases that the axial distance between them is increased by the alternating drive apparatus 119 and it is decreased, either of the joint members 122 moves in the direction for driving the direct acting member 133. By use of it, it is possible to decrease the time zone that the direct acting member 133 is stopped and realize a smoother direct motion using the alternating drive apparatus 119. Further, the joint members 122 moving back and forth can cancel mutually a part of the inertia force, so that low vibration can be realized. Further, the components can be standardized easily such that the first and second joint members 122 are formed as a same component, thus the cost can be decreased.

(3) The alternating drive apparatus 119, first alternating motion member, and second alternating motion member are structured so as to be held between the housing members 129, 130 in the axial direction via a spring element. Therefore, an assembly step of fixing each component is not necessary. Therefore, the cost can be decreased.

(4) The alternating drive apparatus 199 is arranged on the outer peripheral part of the direct acting member 133, thereby will not block the direct acting direction of the direct acting member 133. Therefore, there is no need to reserve a space corresponding to the stroke of the direct acting member 133 for avoiding interference between the alternating drive apparatus 119 and the direct acting member 133 between the two. Therefore, the actuator can be made smaller. Further, only by increasing the length of the direct acting member 133, the stroke of the linear actuator can be enlarged.

(5) The direct acting members 133 pass through the housing members 129, 130 on both sides in the axial direction and are supported in the radial direction by the two shaft support portions 129a, 130a provided at each through portion thereof. Namely, each direct acting member 133 is shaft-supported at the two locations at a comparatively long span, so that the support load when moment is acted externally is reduced and the credibility is improved. Further, the direct acting members 133 pass through the housing members 129, 130, so that there is no need to reserve internally a space corresponding to the stroke of the direct acting members 133 and the linear actuator can be made smaller.

(6) The non-inclined surface of the first wedge joining mechanism and the non-inclined surface of the second wedge joining mechanism are fixed to the direct acting members 133 and the inclined surface of the first wedge joining mechanism and the inclined surface of the second wedge joining mechanism are fixed respectively to the first alternating motion member and second alternating motion member. Here, in consideration of the case that to inhibit wedge joining of the wedge joining mechanism, the wedge joint inhibition mechanism is mounted, the concerned wedge joint inhibition mechanism must be fixed to the inclined surface existing surely in the wedge joint portion instead of the non-inclined surface for moving for the wedge joint portion in the axial direction. Namely, that the inclined surfaces of the wedge joining mechanism are not formed in the direct acting member 133 but formed in the first alternating motion member and second alternating motion member which execute an alternating motion with a micro amplitude is advantageous from this viewpoint.

Further, in the direct acting member 133 having no formed inclined surface, there is no need to mount drive apparatuses such as a wedge joint inhibition mechanism and a solenoid for driving it. Therefore, the mass of the portion for executing the direct motion as output can be prevented from increasing. Therefore, the inertia resistance when functioning as a linear actuator is reduced, thus a high-speed response is enabled. Further, the drive apparatuses of the wedge joint inhibition mechanism can be mounted on the fixing members, so that when supplying power to them via lead wires, the stress due to deformation in correspondence with the operation of the actuator will not act repeatedly and the durability thereof can be ensured.

(7) The first and second wedge joining mechanisms have respectively two kinds of inclined surfaces such as a forward inclined surface at a distance from the central axis decreasing in one axial direction and a backward inclined surface at a distance increasing, permit the wedge joint inhibition mechanisms on the respective inclined surfaces to operate selectively, and include a wedge joining direction converting function for selecting the inclined surface for forming a wedge joint together with the non-inclined surfaces and wedge members from the two kinds of inclined surfaces. Namely, the wedge joining mechanisms can select and switch the inclined surface for forming a wedge joint from the two kinds of forward and backward inclined surfaces. Therefore, the direct acting direction controlled by the inclination direction of the inclined surface of the wedge joint is switched, thus the direct acting member 133 can be moved directly in both directions.

Further, each holding member for operating each wedge joint inhibition mechanism operates by moving in the common axial direction, so that the holding members can be united.

(8) At least one of the first and second wedge joining mechanisms has a common holding member in which the holding member for inhibiting the contact of the forward inclined surface with the wedge member and the holding member for inhibiting the contact of the backward inclined surface with the wedge member are united. As mentioned above, the holding member for inhibiting the contact of the forward inclined surface with the wedge member and the holding member for inhibiting the contact of the backward inclined surface with the wedge member are united, thus the number of components is reduced and furthermore, they can be driven by the common holding member drive mechanism. Therefore, the cost of the linear actuator can be decreased.

(9) At least one of the first and second wedge joining mechanisms has a plurality of wedge members arranged in the circumferential direction and the inclined surfaces in contact with them are formed by a common inner peripheral spherical surface. Therefore, for all the plurality of wedge members arranged in the circumferential direction, there is no need to form inclined surfaces for wedge joining and it is acceptable to form only one spherical surface having an overall continuous circumference. Furthermore, the spherical surface itself is in a rotator shape and in an easily-processed shape, so that the cost of the linear actuator can be decreased.

(10) The forward inclined surface and backward inclined surface of at least one of the first and second wedge joining mechanisms are formed by a common inner peripheral spherical surface. Therefore, there is no need to form the forward inclined surface and backward inclined surface as separate inclined surfaces and can be formed by a common inner peripheral spherical surface. Therefore, the cost of the linear actuator can be decreased.

(11) The wedge member in contact with the inclined surface formed by a part of the inner peripheral spherical surface is generally a rotator having a part of the great circle of the concerned spherical surface as a contour shape and the non-inclined surface of the direct acting member 133 in contact with the concerned wedge member is formed by a concave groove 133a having a part of the great circle aforementioned on the contour of the section perpendicular to the axis. Namely, to decrease the cost, even if the inclined surfaces are formed by a spherical surface continuous in the circumferential direction, the contacting part of the wedge member with the inclined surface and the contacting part of the wedge member with the non-inclined surface can be formed as a line contact instead of a point contact and the material fatigue progressed by the Hertz stress generated at the contacting part is relaxed and the flaking life can be lengthened.

(12) The linear actuator includes an alternating drive apparatus 119 for generating drive force back and forth in the axial direction, a first alternating motion member and a second alternating motion member for executing an alternating motion by the alternating drive apparatus 119, a housing member 129, 130 which is a fixing member, a direct acting member 133 for executing a direct motion back and forth in the axial direction, a first wedge joining mechanism incorporated between the first alternating motion member and the direct acting member 133 for permitting an axial relative displacement in one axial direction between the two and inhibiting an axial relative displacement in the other axial direction, and a second wedge joining mechanism incorporated between the second alternating motion member and the direct acting member 133 for permitting an axial relative displacement in one axial direction between the two and inhibiting an axial relative displacement in the other axial direction.

Therefore, the direct acting member 133 can execute a smoother direct motion using the alternating drive apparatus 119 independently of the shaft support structure of the direct acting member 133. Further, the joint members moving back and forth can cancel mutually a part of the inertia force, so that low vibration can be realized.

(13) The linear actuator can drive the variable operating valve mechanism. In this case, for the automatic transmission controlled by the concerned movable valve or the variable operating valve mechanism, high credibility, low vibration, low cost, and long life span can be realized.

As explained above, according to this embodiment, each load support portion is prevented from action of a surplus load, thus high credibility can be realized. Further, low vibration due to mutual cancel of inertia force, low cost due to standardization of components and reduction in the processing man-hour and assembly man-hour, and miniaturization and long stroke due to avoidance of interference of components can be realized. Further, the mass for executing the direct motion together with the direct acting member 133 is reduced to realize high response, and the Hertz stress (contact stress) of the inter-component contacting part is relaxed, thus the life span can be lengthened. Therefore, a practicable high-performance linear actuator can be obtained.

What is claimed is:

1. A linear actuator comprising:

an alternating drive apparatus for generating drive force back and forth in an axial direction, an alternating motion member for executing alternating motion with a micro amplitude by the alternating drive apparatus, a fixing member fixed to a housing member, a direct acting member for executing direct motion back and forth in the axial direction, a first wedge joining mechanism incorporated between the alternating motion member and the direct acting member for permitting a relative displacement in one axial direction and inhibiting a relative displacement in the other axial direction, and a second wedge joining mechanism incorporated between the fixing member and the direct acting member for permitting a relative displacement in one axial direction and inhibiting a relative displacement in the other axial direction, wherein:

the first wedge joining mechanism and the second wedge joining mechanism include an inclined surface composed of an inclined surface at a distance from a central axis increasing in the axial direction and an inclined surface at a distance decreasing, a non- inclined surface at a constant distance from the central axis, a wedge member arranged between the inclined surface and the non-inclined surface, a holding member of the wedge member for inhibiting wedge joining by the inclined surface, the non-inclined surface, and the wedge member, and a wedge joint inhibition mechanism composed of a drive section of the holding member, and the non-inclined surface of the first wedge joining mechanism and the non-inclined surface of the second wedge joining mechanism are formed on the direct acting member, the inclined surface of the first wedge joining mechanism is formed on the alternating motion member, and the inclined surface of the second wedge joining mechanism is formed to the fixing member.

2. The linear actuator according to claim 1, wherein in the first wedge joining mechanism, the alternating motion member is arranged on an outer peripheral side of the direct acting member and in the second wedge joining mechanism, the fixing member is arranged on an outer peripheral side of the direct acting member.

3. The linear actuator according to claim 1, wherein:

the first wedge joining mechanism and the second wedge joining mechanism include two kinds of inclined surfaces such as a forward inclined surface at a decreasing distance from the central axis and a backward inclined surface at an increasing distance from the central axis and a wedge joining direction converting function for permitting the wedge joint inhibition mechanism to operate at a selective position and selecting an inclined surface for forming a wedge joint together with the wedge member from the two kinds of inclined surfaces.

4. The linear actuator according to claim 1, wherein:

the wedge joint inhibition mechanism has a holding member for inhibiting the wedge member from making contact with the inclined surface by pressing means and the holding member moves back and forth in the axial direction by the drive section of the holding member fixed to the fixing member.

5. The linear actuator according to claim 3, wherein at least one of the first wedge joining mechanism and the second wedge joining mechanism has a common holding member composed of the holding member for inhibiting contact of the forward inclined surface with the wedge member united with the holding member for inhibiting contact of the backward inclined surface with the wedge member.

6. The linear actuator according to claim 5, wherein both the first wedge joining mechanism and the second wedge joining mechanism have the common holding members and both the common holding members are united.

7. The linear actuator according to claim 1, wherein at least one of the first wedge joining mechanism and the second wedge joining mechanism has a plurality of wedge members arranged in a circumferential direction and the inclined surfaces in contact with the plurality of wedge members are formed by a common inner peripheral spherical surface.

8. The linear actuator according to claim 7, wherein a forward inclined surface and a backward inclined surface of at least one of the first wedge joining mechanism and the second wedge joining mechanism are formed by a common inner peripheral spherical surface.

9. The linear actuator according to claim 7, wherein:

the wedge member in contact with the inclined surface formed by a part of the inner peripheral spherical surface is a rotator having a contour shape composed of a part of a great circle of the spherical surface and the non-inclined surface of the direct acting member in contact with the wedge member is a concave groove having a contour of a right-angled section of a shaft of the direct acting member composed of a part of the great circle.

* * * * *